US010468433B2

(12) United States Patent
Kim et al.

(10) Patent No.: US 10,468,433 B2
(45) Date of Patent: Nov. 5, 2019

(54) THREE-DIMENSIONAL SEMICONDUCTOR DEVICES INCLUDING GATE ELECTRODES

(71) Applicant: Samsung Electronics Co., Ltd., Suwon-si, Gyeonggi-do (KR)

(72) Inventors: Kwang Soo Kim, Hwaseong-si (KR); Young Jin Jung, Hwaseong-si (KR); Jae Duk Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/015,702

(22) Filed: Jun. 22, 2018

(65) Prior Publication Data

US 2019/0139985 A1    May 9, 2019

(30) Foreign Application Priority Data

Nov. 3, 2017 (KR) ........................ 10-2017-0145848

(51) Int. Cl.
*H01L 27/1159* (2017.01)
*H01L 27/11597* (2017.01)
(Continued)

(52) U.S. Cl.
CPC .... *H01L 27/11597* (2013.01); *H01L 27/0207* (2013.01); *H01L 27/1156* (2013.01); *H01L 27/1159* (2013.01); *H01L 27/11519* (2013.01); *H01L 27/11521* (2013.01); *H01L 27/11526* (2013.01); *H01L 27/11548* (2013.01); *H01L 27/11551* (2013.01); *H01L 27/11556* (2013.01);
(Continued)

(58) Field of Classification Search
None
See application file for complete search history.

(56) References Cited

U.S. PATENT DOCUMENTS 9,230,984 B1    1/2016    Takeguchi
9,306,041 B2    4/2016    Hwang et al.
(Continued)

FOREIGN PATENT DOCUMENTS

KR    2015-0116995 A    10/2015

OTHER PUBLICATIONS

Invitation to Respond to Written Opinion, Singapore Patent Application No. 1020180522W, dated Sep. 18, 2018, 9 pages.
(Continued)

*Primary Examiner* — Minh Loan Tran
(74) *Attorney, Agent, or Firm* — Sughrue Mion, PLLC

(57) ABSTRACT

A three-dimensional semiconductor device is provided including main separation structures disposed on a substrate, and extending in a first direction, parallel to a surface of the substrate; gate electrodes disposed between the main separation structures; a first secondary separation structure penetrating through the gate electrodes, between the main separation structures, and including a first linear portion and a second linear portion, having end portions opposing each other; and second secondary separation structures disposed between the first secondary separation structure and the main separation structures, and penetrating through the gate electrodes. The second secondary separation structures have end portions opposing each other between the second linear portion and the main separation structures.

20 Claims, 31 Drawing Sheets

(51) Int. Cl.
*H01L 27/11578* (2017.01)
*H01L 27/11568* (2017.01)
*H01L 27/11556* (2017.01)
*H01L 27/11551* (2017.01)
*H01L 27/11595* (2017.01)
*H01L 27/11526* (2017.01)
*H01L 27/11521* (2017.01)
*H01L 27/11519* (2017.01)
*H01L 27/11548* (2017.01)
*H01L 27/1156* (2017.01)
*H01L 27/11565* (2017.01)
*H01L 27/11575* (2017.01)
*H01L 27/11582* (2017.01)
*H01L 27/02* (2006.01)
*H01L 29/10* (2006.01)
*H01L 29/423* (2006.01)
*H01L 21/033* (2006.01)
*H01L 21/311* (2006.01)
*H01L 29/66* (2006.01)
*H01L 29/792* (2006.01)

(52) U.S. Cl.
CPC .. *H01L 27/11565* (2013.01); *H01L 27/11568* (2013.01); *H01L 27/11575* (2013.01); *H01L 27/11578* (2013.01); *H01L 27/11582* (2013.01); *H01L 27/11595* (2013.01); *H01L 29/1037* (2013.01); *H01L 29/4234* (2013.01); *H01L 21/0337* (2013.01); *H01L 21/31144* (2013.01); *H01L 29/66545* (2013.01); *H01L 29/66833* (2013.01); *H01L 29/7926* (2013.01)

(56) References Cited

U.S. PATENT DOCUMENTS

| | | |
|---|---|---|
| 9,331,091 B1 | 5/2016 | Cernea |
| 9,425,205 B2 | 8/2016 | Shimura |
| 9,553,101 B2 | 1/2017 | Kim et al. |
| 9,564,451 B1 | 2/2017 | Shin et al. |
| 9,640,549 B2 | 5/2017 | Lee et al. |
| 9,721,663 B1* | 8/2017 | Ogawa ............... G11C 16/0483 |
| 9,941,291 B2* | 4/2018 | Lee ..................... H01L 29/7827 |
| 9,960,173 B2* | 5/2018 | Shimojo ............ H01L 27/11519 |
| 2015/0137216 A1 | 5/2015 | Lee et al. |
| 2015/0372101 A1 | 12/2015 | Lee et al. |
| 2016/0035732 A1 | 2/2016 | Lee et al. |
| 2016/0240547 A1 | 8/2016 | Tagami et al. |
| 2016/0268263 A1 | 9/2016 | Lee et al. |
| 2017/0207221 A1 | 7/2017 | Kim et al. |
| 2017/0207232 A1* | 7/2017 | You ................... H01L 27/11521 |
| 2017/0263556 A1 | 9/2017 | Tessariol et al. |
| 2017/0263618 A1 | 9/2017 | Shimojo |
| 2017/0301687 A1 | 10/2017 | Takahashi et al. |
| 2018/0182775 A1 | 6/2018 | Kim et al. |

OTHER PUBLICATIONS

Communication dated Apr. 5, 2019, issued by the European Patent Office in counterpart European Application No. 18203087.4.

* cited by examiner

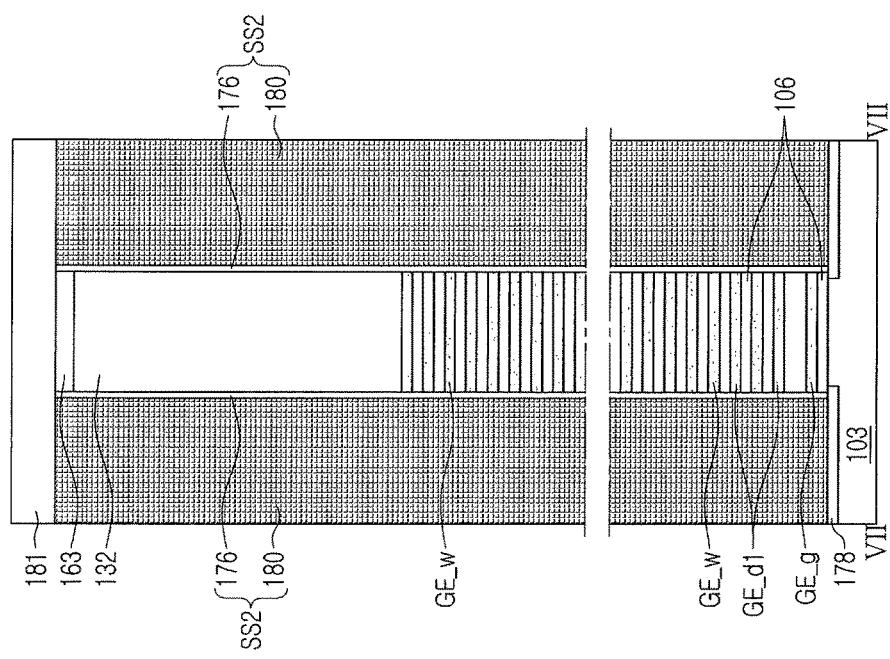

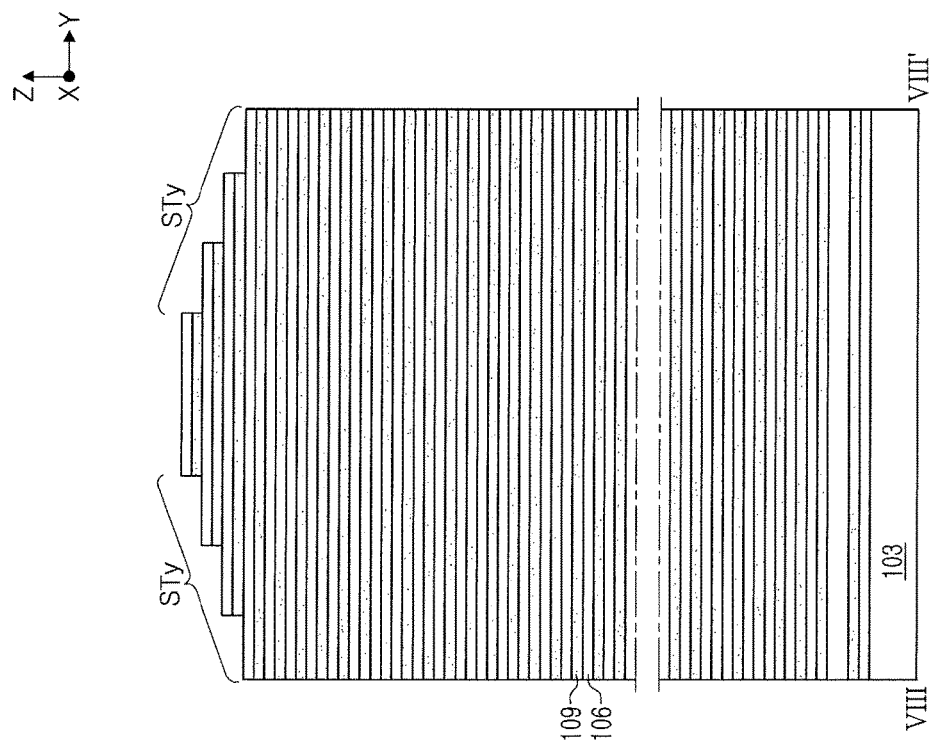

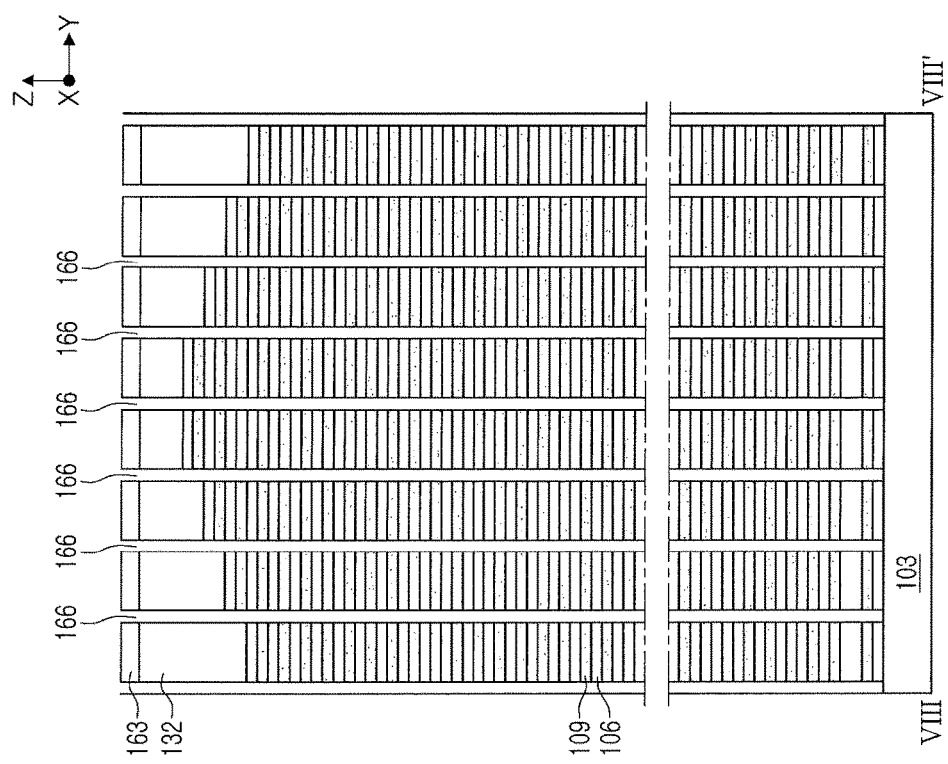

THREE-DIMENSIONAL SEMICONDUCTOR DEVICES INCLUDING GATE ELECTRODES

CROSS-REFERENCE TO RELATED APPLICATION

This application claims benefit of priority to Korean Patent Application No. 10-2017-0145848 filed on Nov. 3, 2017 in the Korean Intellectual Property Office, the disclosure of which is hereby incorporated herein by reference in its entirety.

FIELD

The present inventive concept relates generally to a semiconductor device and, more particularly, to a three-dimensional semiconductor device including gate electrodes.

BACKGROUND

Semiconductor devices, including gate electrodes stacked in directions perpendicular to surfaces of semiconductor substrates, have been developed. The number of stacked gate electrodes has increased in order to obtain highly-integrated semiconductor devices. As such, as the number of gate electrodes stacked in a direction perpendicular to a surface of a semiconductor substrate has gradually increased, the degree of difficulty in a gate formation process has also gradually increased, and thus, unanticipated defects may occur.

SUMMARY

Some embodiments of the present inventive concept provide a three-dimensional semiconductor device including separation structures disposed on a substrate, and extending in a first direction, parallel to a surface of the substrate; gate electrodes disposed between the main separation structures; a first secondary separation structure penetrating through the gate electrodes, between the main separation structures, and including a first linear portion and a second linear portion, having end portions opposing each other; and second secondary separation structures disposed between the first secondary separation structure and the main separation structures, and penetrating through the gate electrodes. The second secondary separation structures have end portions opposing each other between the second linear portion and the main separation structures.

Further embodiments of the present inventive concept provide a three-dimensional semiconductor device including main separation structures traversing a memory cell array region and a connection region of a substrate; gate electrodes including pad regions, sequentially stacked on the memory cell array region and extending to the connection region to be arranged in a stepped manner in the connection region, between the main separation structures; a first secondary separation structure penetrating through the gate electrodes between the main separation structures; and second secondary separation structures disposed between the first secondary separation structure and the main separation structures, and penetrating through the gate electrodes. The first secondary separation structure includes a first linear portion extending to the connection region while traversing the memory cell array region, and a second linear portion disposed on the connection region and having an end portion opposing the first linear portion in the connection region. The second secondary separation structures have end portions opposing each other in the connection region.

Still further embodiments of the present inventive concept provide a three-dimensional semiconductor including a substrate including a memory cell array region and a connection region adjacent to the memory cell array region; gate electrodes stacked in a direction perpendicular to a surface of the substrate in the memory cell array region, and extending to the connection region; main separation structures penetrating through the gate electrodes, while traversing the memory cell array region and the connection region; a first secondary separation structure including a first linear portion and a second linear portion, penetrating through the gate electrodes between the main separation structures, and having opposing end portions in the connection region; and second secondary separation structures located on both sides of the first secondary separation structure, and penetrating through the gate electrodes between the first secondary separation structure and the main separation structures. The second secondary separation structures have end portions spaced apart from each other while opposing each other, in the connection region. Each of the second secondary separation structures has a length shorter than a length of each of the first and second linear portions of the first secondary separation structure.

BRIEF DESCRIPTION OF DRAWINGS

The above and other aspects, features, and advantages of the present disclosure will be more clearly understood from the following detailed description, taken in conjunction with the accompanying drawings, in which:

FIG. 9C is a cross-section of a region taken along line VII-VII' of FIG. 8.

DETAILED DESCRIPTION

Figure 1:
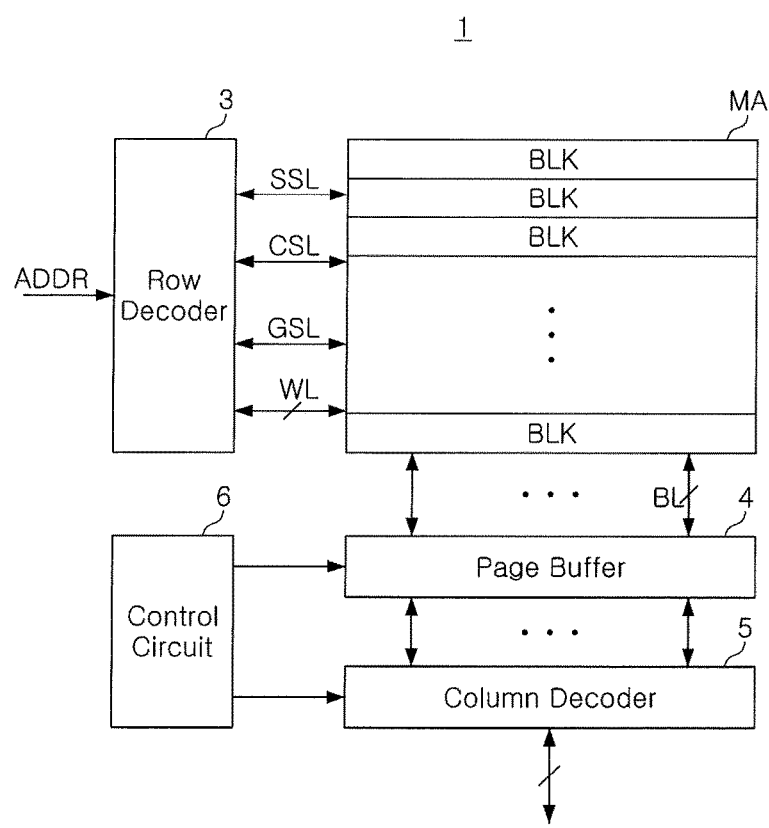
FIG. 1 is a schematic block diagram of a three-dimensional semiconductor device according to some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An example of a three-dimensional semiconductor device according to some embodiments of the present inventive concept will be described with reference to FIG. 1. FIG. 1 is a schematic block diagram of a semiconductor device according to some embodiments.

Referring to FIG. 1, a three-dimensional semiconductor device 1 may include a memory cell array region MA, a row decoder 3, a page buffer 4, a column decoder 5, and a control circuit 6. The memory cell array region MA may include memory blocks BLK.

The memory cell array region MA may include memory cells arranged in a plurality of rows and columns. The memory cells included in the memory cell array region MA may be electrically connected to the row decoder 3 through word lines WL, at least one common source line CSL, string select lines SSL, at least one ground select line GSL, or the like, and may be electrically connected to the page buffer 4 and the column decoder 5 through bit lines BL.

In some embodiments, among the memory cells, memory cells arranged in a signal row may be connected to a single word line WL, and memory cells arranged in a single column may be connected to a single bit line BL.

The row decoder 3 may be commonly connected to the memory blocks BLK, and may provide a driving signal to the word lines WL of the memory blocks BLK selected in response to a block select signal. For example, the row decoder 3 may receive address information ADDR externally, may decode the received address information ADDR, and may determine a voltage supplied to at least a portion of the word lines WL, the common source line CSL, the string select lines SSL, and the ground select line GSL, electrically connected to the memory blocks BLK.

The page buffer 4 may be electrically connected to the memory cell array region MA through the bit lines BL. The page buffer 4 may be connected to a bit line BL selected by an address decoded by the column decoder 5. The page buffer 4 may temporarily store data to be stored in memory cells, or may sense data stored in memory cells, depending on an operating mode. For example, the page buffer 4 may operate as a write driver circuit in a program operating mode, and may operate as a sense amplifier circuit in a read operating mode. The page buffer 4 may receive power, for example, a voltage or a current, from a control logic, and may provide the received power to the selected bit line BL.

The column decoder 5 may provide a data transmission path between the page buffer 4 and an external device, for example, a memory controller. The column decoder 5 may decode an externally input address to select one of the bit lines BL.

The column decoder 5 may be commonly connected to the memory blocks BLK, and may provide data information to bit lines BL of the memory block BLK selected by a block select signal.

The control circuit 6 may control overall operations of the three-dimensional semiconductor device 1. The control circuit 6 may receive a control signal and an external voltage, and may operate in response to the received control signal. The control circuit 6 may include a voltage generator generating voltages, for example, a program voltage, a read voltage, a removal voltage, or the like, required for internal operations, using the external voltage. The control circuit 6 may control reading, writing, and/or erasing operations in response to control signals.

Figure 2:
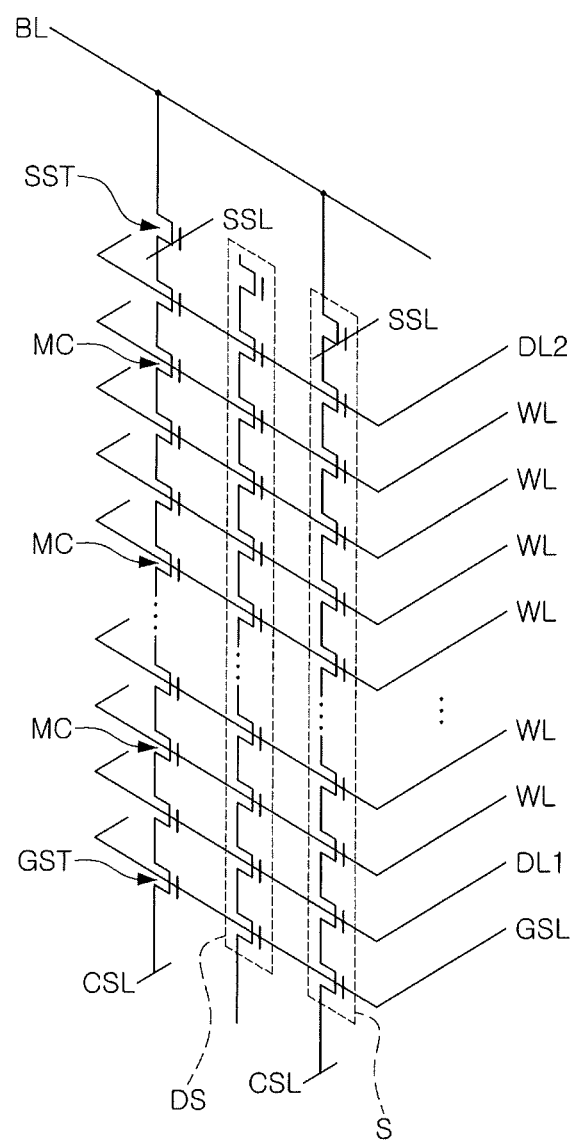
FIG. 2 is a circuit diagram of an example of a memory cell array region of a three-dimensional semiconductor device according to some embodiments of the present inventive concept.

With reference to FIG. 2, an example of the circuit in the memory cell array region (see MA of FIG. 1) of the three-dimensional semiconductor device (see 1 of FIG. 1) described above with reference to FIG. 1 will be described below. FIG. 2 is a circuit diagram of an example of the memory cell array region (see MA of FIG. 1).

With reference to FIG. 2, the memory cell array region (see MA of FIG. 1) may include memory strings S, including memory cells MC connected to each other in series, and a ground select transistor GST and a string select transistor SST, connected to both ends of the memory cells MC in series, respectively. The memory cells MC connected to each other in series may be connected to the word lines WL to select the memory cells MC, respectively.

A gate terminal of the ground select transistor GST may be connected to a ground select line GSL, and a source terminal thereof may be connected to the common source line CSL. A gate terminal of the string select transistor SST may be connected to a string select line SSL, and a source terminal thereof may be connected to a drain terminal of the memory cells MC.

Although FIG. 2 illustrates a structure in which one ground select transistor GST and one string select transistor SST are connected to the memory cells MC connected to each other in series, respectively, in a manner different therefrom, a plurality of ground select transistors GST or a plurality of string select transistors SST may be connected to the memory cells MC.

In some embodiments, a first dummy line DL1 may be disposed between a lowermost word line WL among the word lines WL and the ground select line GSL, and a second dummy line DL2 may be disposed between an uppermost word line WL among the word lines WL and the string select line SSL. The first dummy line DL1 may be provided as one or a plurality of dummy lines, and the second dummy line DL2 may be provided as one or a plurality of dummy lines.

A drain terminal of the string select transistor SST may be connected to the bit line BL. For example, when a signal is applied to a gate terminal of the string select transistor SST via the string select line SSL, a signal applied via the bit line BL may be transmitted to the memory cells MC connected to each other in series, and thus, data reading and writing operations may be performed. Furthermore, as a predetermined erase voltage is applied via a substrate, an erasing operation of erasing data written to the memory cells MC may also be executed.

The three-dimensional semiconductor device according to some embodiments may include at least one dummy string DS. The dummy string DS may be a string including a dummy channel electrically isolated from the bit line BL.

Figure 3:
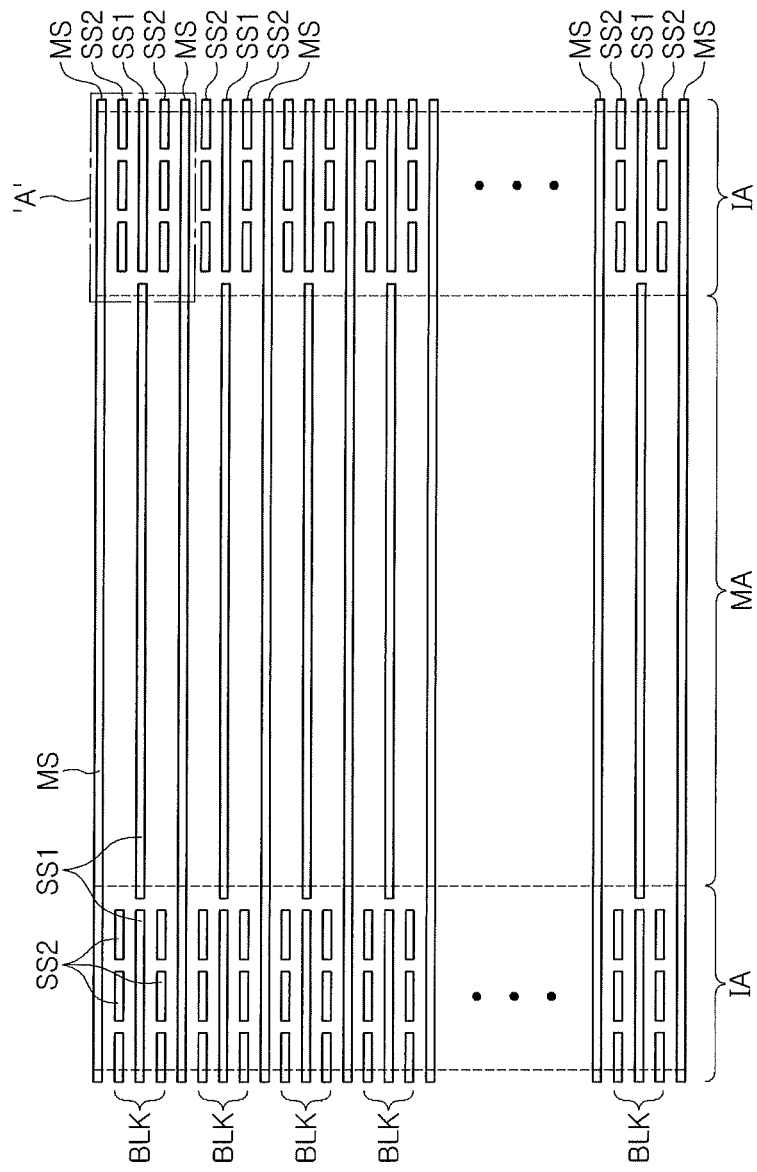
FIG. 3 is a plan view of an example of a three-dimensional semiconductor device according to some embodiments of the present inventive concept.

Hereinafter, an example of the three-dimensional semiconductor device according to some embodiments will be described with reference to FIGS. 3 and 4. FIG. 3 is a plan view of an example of a memory cell array region of the three-dimensional semiconductor device according to some embodiments, and FIG. 4 is a plan view of an example of the three-dimensional semiconductor device according to some embodiments, as an enlarged view of portion 'A' of FIG. 3.

Figure 4:
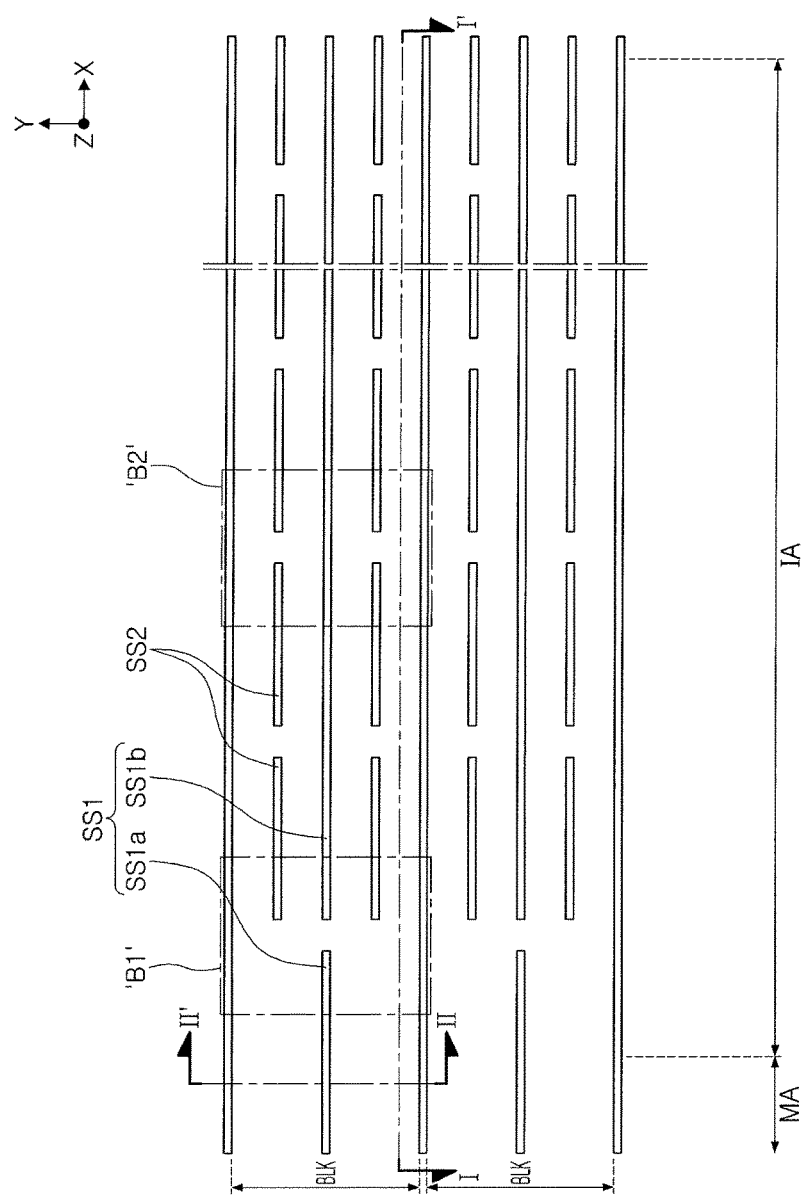
FIGS. 4 and 5 are enlarged plan views of portions of FIG. 3, in an example of a three-dimensional semiconductor device according to some embodiments of the present inventive concept.

With reference to FIGS. 3 and 4, memory blocks BLK may be disposed on a memory cell array region MA. A connection region IA may be disposed on at least one side of the memory cell array region MA. For example, the connection region IA may be disposed on both sides of the memory cell array region MA, opposing each other.

In some embodiments, the memory cell array region MA may be a region in which memory cells (see MC of FIG. 2) are disposed, and the connection region IA may be a region in which pad regions of gate electrodes in contact with contact plugs to apply an electrical signal or a voltage to the string select lines (see SSL of FIG. 2), the word lines (see WL of FIG. 2), and/or the ground select line (see GSL of FIG. 2) are disposed. The memory blocks BLK may be disposed between main separation structures MS traversing the memory cell array region MA and the connection region IA. The memory blocks BLK may respectively be disposed between a pair of main separation structures MS, adjacent to each other. Thus, one memory block BLK may be disposed between one pair of main separation structures MS adjacent to each other.

Hereinafter, configurations disposed between one pair of main separation structures MS adjacent to each other will be mainly described.

A plurality of secondary separation structures may be disposed between the main separation separations MS. The main separation structures MS may have a linear shape extending in a first direction X. The plurality of secondary separation structures may respectively have a linear shape or a bar shape extending in the first direction X. The plurality of secondary separation structures may respectively have a linear shape or a bar shaped having a length shorter than that of each of the main separation structures MS.

The plurality of secondary separation structures may include a first secondary separation structure SS1 and second secondary separation structures SS2.

The first secondary separation structure SS1 may include a first linear portion SS1a and a second linear portion SS1b, having ends opposing each other, while being spaced apart from each other.

The first linear portion SS1a of the first secondary separation structure SS1 may transverse the memory cell array region MA to extend to a portion of the connection region IA, and the second linear portion SS1b of the first secondary separation structure SS1 may be disposed in the connection region IA and may have an end opposing an end of the first linear portion SS1A.

The second secondary separation structures SS2 may be disposed between the first secondary separation structure SS1 and the main separation structures MS. The second secondary separation structures SS2 may be provided as a plurality of structures, having a linear shape or a bar shape, to be arranged in a length direction, for example, in the first direction X, and may be spaced apart from each other. Each of the second secondary separation structures SS2 may have a length shorter than a length of each of the first and second linear portions SS1A and SS1b of the first secondary separation structure SS1, in the first direction X.

In some embodiments, the second secondary separation structures SS2 may be disposed between the second linear portion SS1b of the first secondary separation structure S S1 and the main separation structures MS. The second secondary separation structures SS2 may have ends opposing each other, between the second linear portion SS1b of the first secondary separation structure SS1 and the main separation structures MS. The ends of the second secondary separation structures SS2, opposing each other, may be arranged in the first direction X.

Figure 5:
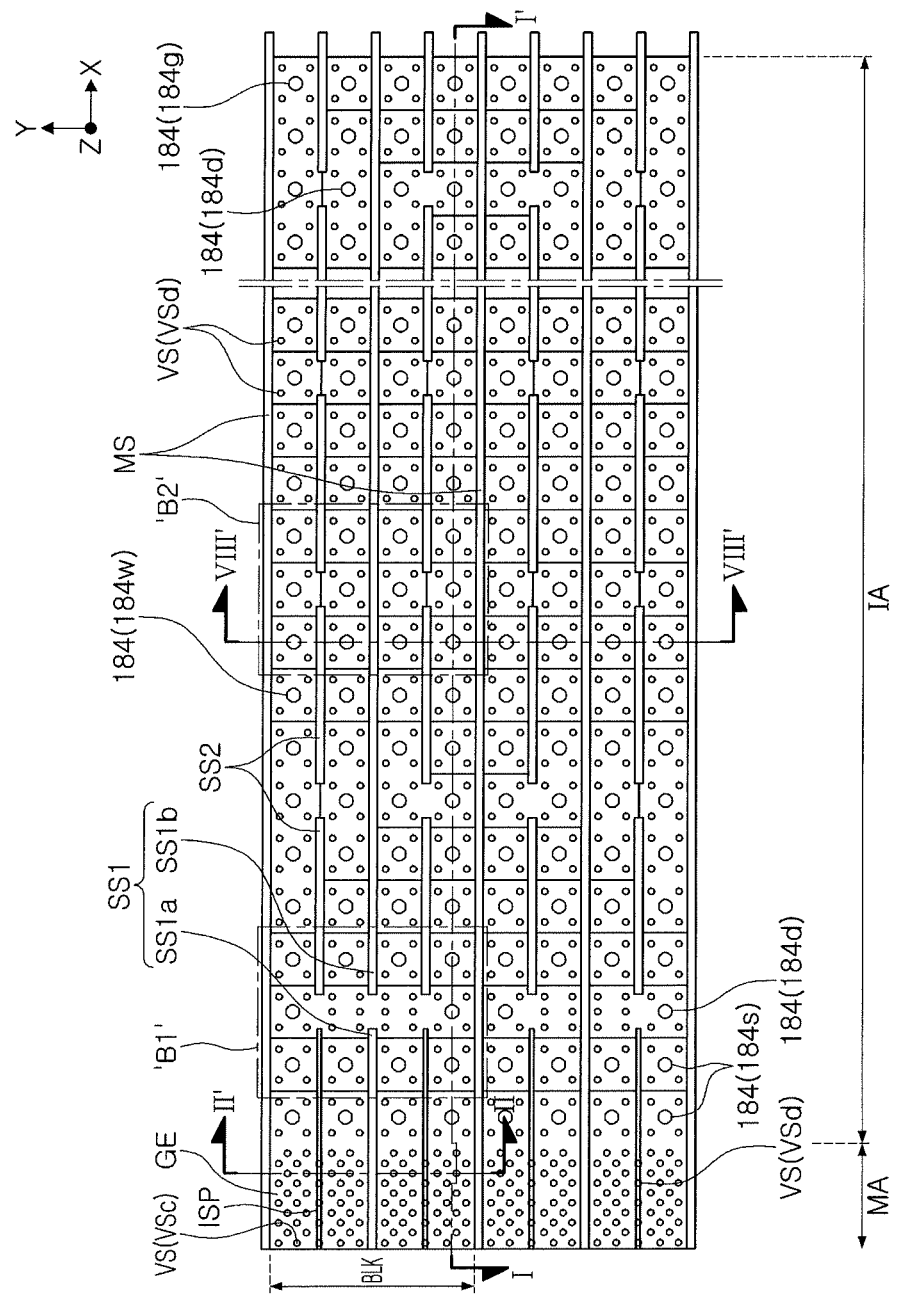
Figure 6:
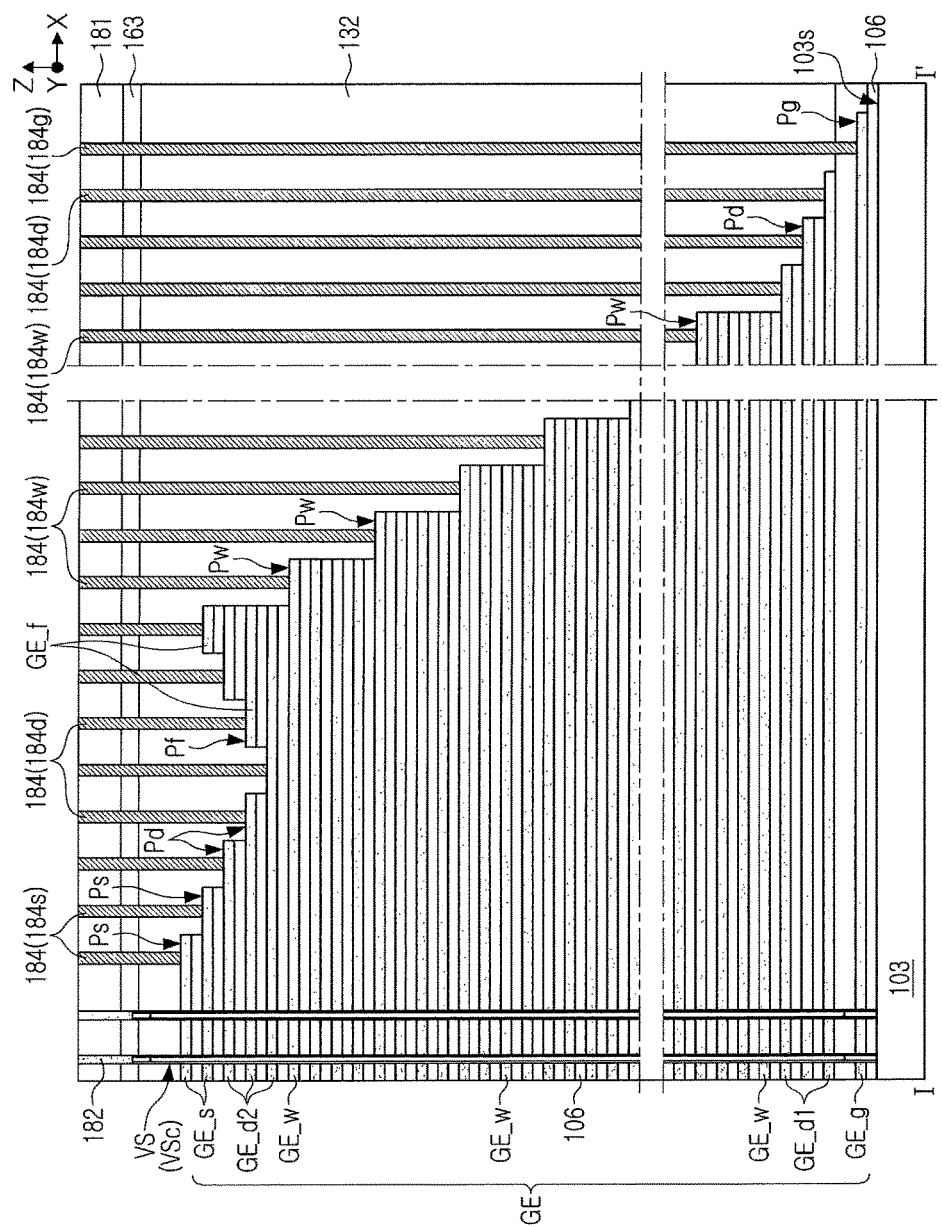
FIG. 6 is a cross-section of a region taken along line I-I' of FIG. 5.
Figure 7:
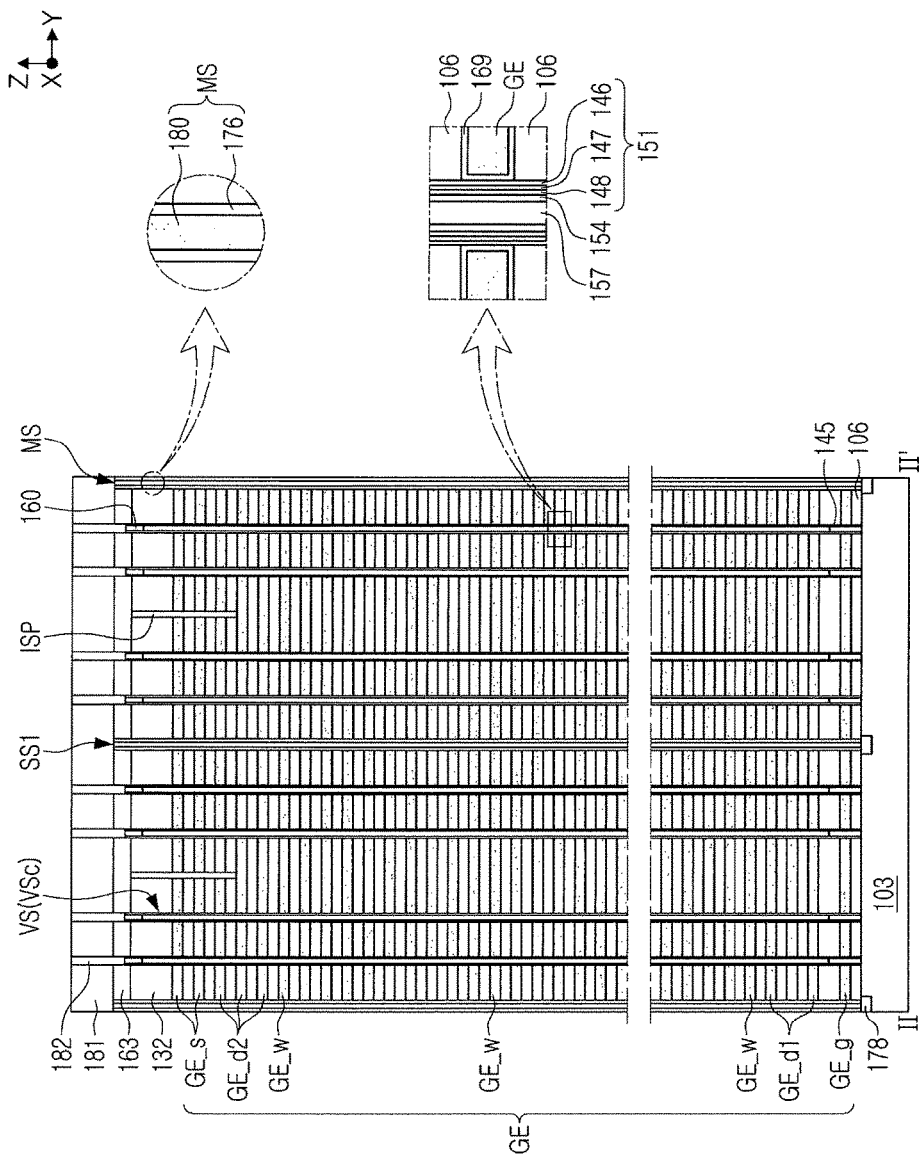
FIG. 7 is a cross-section of a region taken along line II-II' of FIG. 5.
Figure 8:
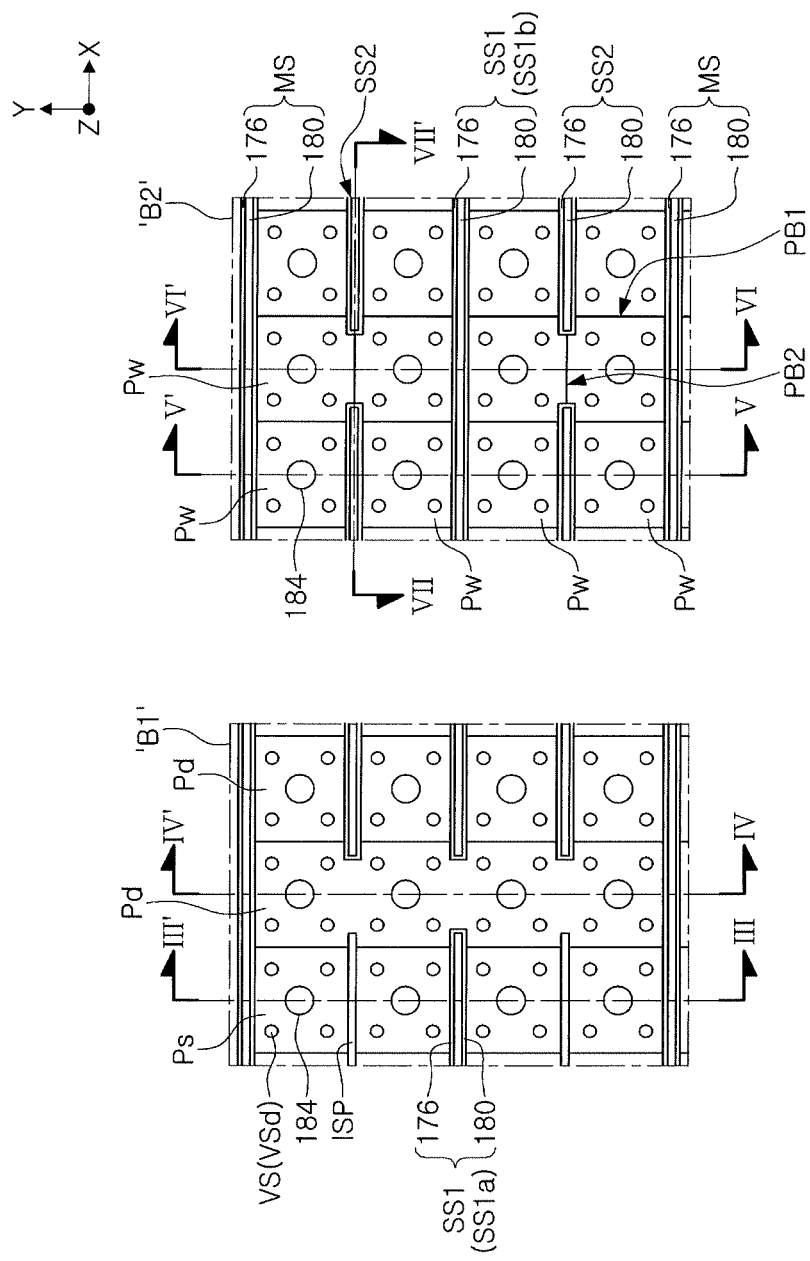
FIG. 8 provides enlarged plan views of portions 'B1' and 'B2' of FIGS. 4 and 5, in an example of a three-dimensional semiconductor device according to some embodiments of the present inventive concept.
Figure 9A:
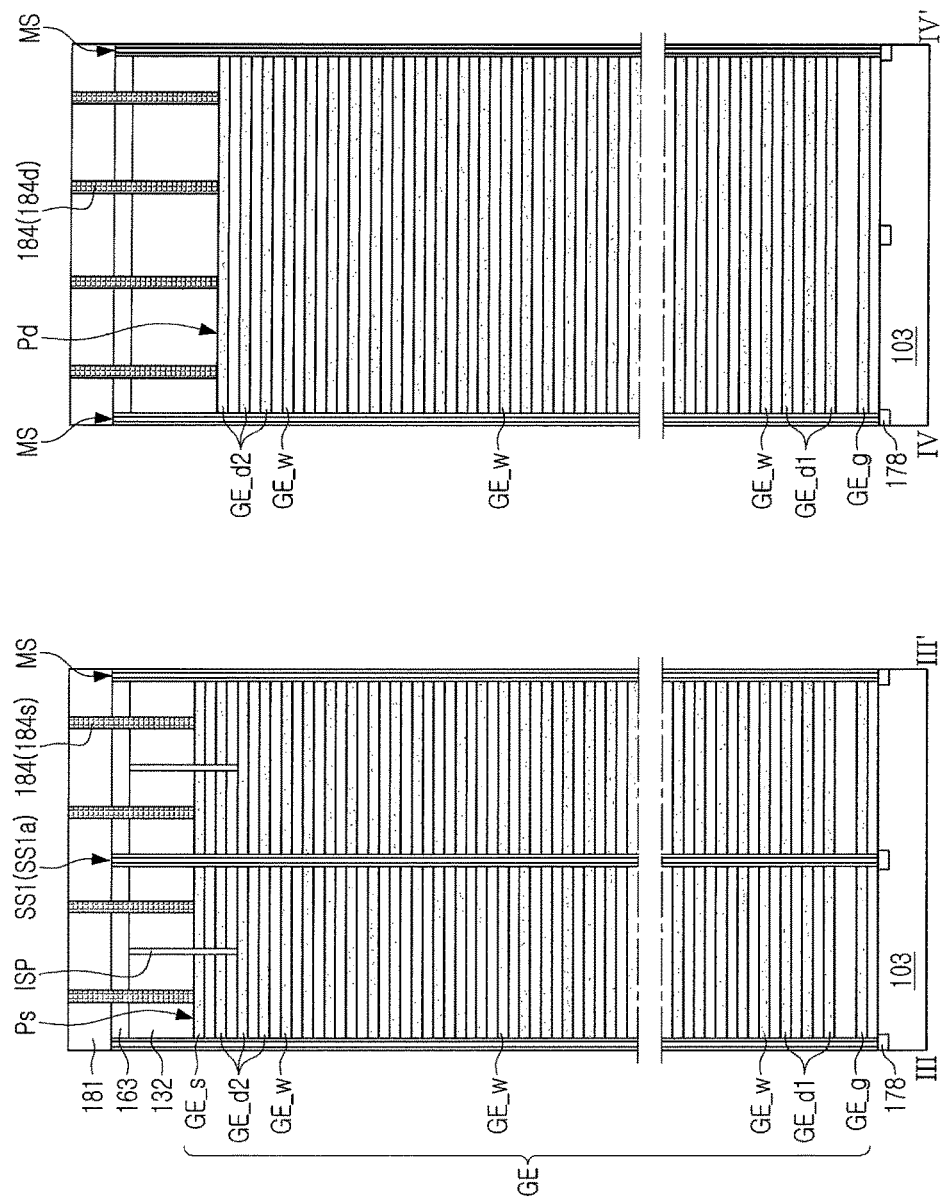
FIG. 9A provides cross-sections of regions taken along line III-III' and line IV-IV' of FIG. 8.
Figure 9B:
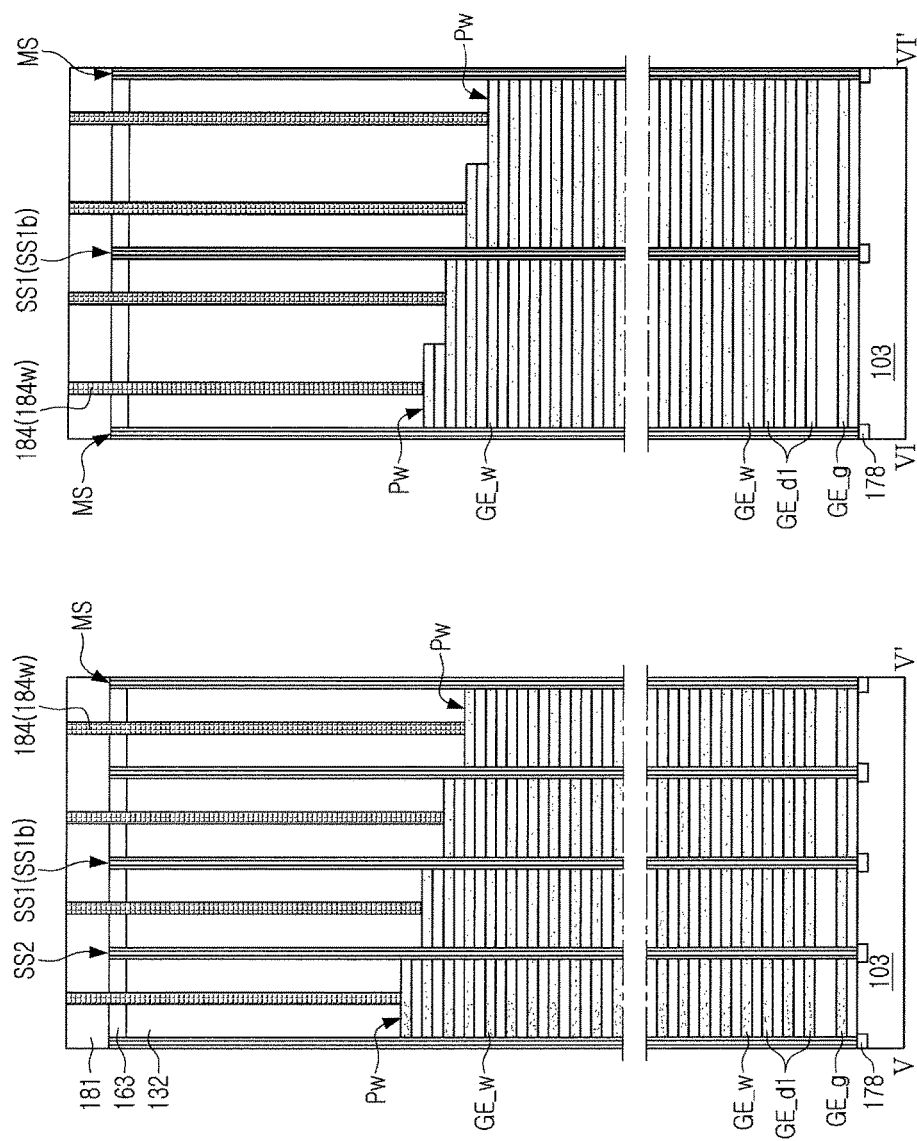
FIG. 9B provides cross-sections of regions taken along line V-V' and line VI-VI' of FIG. 8.

Various types of constituent elements, as well as the first and second secondary separation structures SS1 and SS2, may be disposed between the main separation structures MS. An example of a three-dimensional semiconductor device, including the main separation structures MS and the first and second secondary separation structures SS1 and SS2, will be described with reference to FIGS. 5, 6, 7, 8, 9A, 9B and 9C. FIG. 5 is an enlarged plan view of portion 'A' of FIG. 3 in an example of the three-dimensional semiconductor device according to some embodiments. FIG. 6 is a cross-section of a region taken along line I-I' of FIG. 5. FIG. 7 is a cross-section of a region taken along line II-II' of FIG. 5. FIG. 8 illustrates enlarged plan views of portions 'B1' and 'B2' of FIGS. 4 and 5. FIG. 9A provides cross-sections of regions taken along lines III-III' and IV-IV' of FIG. 8, FIG. 9B provides cross sectional views of regions taken along lines V-V' and VI-VI' of FIG. 8, and FIG. 9C is a cross-section of a region taken along line VII-VII' of FIG. 8.

Referring to FIGS. 5 to 8, 9A, 9B and 9C, the main separation structures MS and the first and second secondary separation structures SS1 and SS2 as described above with reference to FIGS. 3 and 4 may be disposed on a substrate 103.

The substrate 103 may be a semiconductor substrate that may be formed of a semiconductor material such as silicon or the like. The substrate 103 may be a bulk silicon substrate or an SOI substrate.

The main separation structures MS and the first and second secondary separation structures SS1 and SS2 may have a linear shape extending in a first direction X, to be parallel to a surface 103s of the substrate 103.

Gate electrodes GE may be disposed on the substrate 103 between the main separation structures MS. The gate electrode GE may be formed of a conductive material, including at least one of doped polysilicon, a metal nitride such as TiN, a metal silicide such as WSi, TiSi, TaSi or the like, or a metal such as W. The doped polysilicon may be a polysilicon including an N-type impurity such as P, As or the like, or a P-type impurity such as B or the like.

The gate electrodes GE may be sequentially stacked to be spaced apart from each other, in a direction Z, perpendicular to the surface 103s of the substrate 103, on the memory cell array region MA, while extending to an upper portion of the connection region IA. The gate electrodes GE may be spaced apart from each other by interlayer insulating layers 106, while being arranged in the direction Z perpendicular to the surface 103s of the substrate 103. A lowermost interlayer insulating layer among the interlayer insulating layers 106 may be interposed between a lowermost gate electrode among the gate electrodes GE and the substrate 103.

The gate electrodes GE may include one or a plurality of lower gate electrodes GE_g or GE_d1, a plurality of intermediate gate electrodes GE_w disposed above the one or the plurality of lower gate electrodes GE_g or GE_d1, and a plurality of upper gate electrodes GE_s and GE_d2 disposed above the plurality of intermediate gate electrodes GE_w.

In some embodiments, the one or the plurality of lower gate electrodes GE_g or GE_d1 may be provided as a plurality of gate electrodes. As the plurality of lower gate electrodes GE_g and GE_d1, a lower select gate electrode GE_g and one or a plurality of lower dummy gate electrodes GE_d1 disposed above the lower select gate electrode GE_g may be provided. The lower select gate electrode GE_g may be the ground select line (see GSL of FIGS. 1 and 2) described above with reference to FIGS. 1 and 2.

The plurality of intermediate gate electrodes GE_w may be word lines described above with reference to FIGS. 1 and 2.

In some embodiments, the one or the plurality of upper gate electrodes GE_s and GE_d2 may be provided as a plurality of gate electrodes. In the plurality of upper gate electrodes GE_s and GE_d2, an uppermost upper gate electrode and/or a second uppermost gate electrode may be an upper select gate electrode GE_s, and one or a plurality of upper gate electrodes disposed between the upper select gate electrode GEs and the plurality of intermediate gate electrodes GE_w may be an upper dummy gate electrode GE_d2. The upper select gate electrode GE_s may be the string select lines (see SSL of FIGS. 1 and 2) described above with reference to FIGS. 1 and 2.

In the first secondary separation structure SS1, the first linear portion SS1a may transverse the upper select gate electrode GE_s, and the second linear portion SS1b may be spaced apart from the upper select gate electrode GE_s. In some embodiments, the second secondary separation structures SS2 may be spaced apart from the upper select gate electrode GE_s.

On the connection region IA, floating dummy gate electrodes GE_f may be disposed to oppose a portion of the upper gate electrodes GE_s and GE_d2, while being disposed above the plurality of intermediate gate electrodes GE_w. The floating dummy gate electrodes GE_f may be formed of the same material as that of the gate electrodes GE. The floating dummy gate electrodes GE_f may include floating pad regions Pf arranged in a stepwise manner in which the floating pad regions Pf are sequentially lowered in a direction toward the upper gate electrodes GE_s and GE_d2. The floating dummy gate electrodes GE_f may be spaced apart from the memory cell array region MA.

The gate electrodes GE may be disposed between the main separation structures MS. The main separation structures MS may penetrate through the gate electrodes GE while traversing the gate electrodes GE. The gate electrodes GE may be penetrated by the first and second secondary separation structures SS1 and SS2, between the main separation structures MS.

The main separation structures MS, and the first and second secondary separation structures SS1 and SS2 may each include a conductive pattern 180 and a spacer 176 covering a side of the conductive pattern 180. The spacer 176 may be formed of an insulating material such as a silicon oxide, a silicon nitride, or the like. The spacer 176 may allow the conductive pattern 180 and the gate electrodes GE to be spaced apart from each other. The conductive pattern 180 may be formed of a conductive material including at least one of doped polysilicon, a metal nitride such as titanium nitride or the like, or a metal such as tungsten or the like. In some embodiments, the conductive pattern 180 may be referred to as a source contact plug.

Impurity regions 178 may be disposed in the substrate 103, below the main separation structures MS and the first and second secondary separation structures SS1 and SS2. The impurity regions 178 may form the common source line (see CSL of FIGS. 1 and 2) described above with reference to FIGS. 1 and 2. The impurity regions 178 may have N-type conductivity, and a portion of the substrate 103 adjacent to the impurity regions 178 may have P-type conductivity.

Insulating linear patterns ISP may be disposed to traverse the upper select gate electrode GE_s while separating the upper select gate electrode GE_s in a length direction of the main and secondary separation structures MS, SS1 and SS2, for example, in the first direction X. The insulating linear patterns ISP may be disposed to be higher than a level of the plurality of intermediate gate electrodes GE_w. Ends of the insulating linear patterns ISP may oppose ends of the second secondary separation structures SS2. The insulating linear patterns ISP may be formed of silicon oxide. In some embodiments, the insulating linear patterns ISP may have a linear shape extending in the first direction X, and may be interposed between the first linear portion SS1a of the first secondary separation structure SS1 and the main separation structures MS. In some embodiments, the second secondary separation structures SS2 may be spaced apart from the upper select gate electrode GE_s.

The gate electrodes GE may include pad regions arranged three-dimensionally on the connection region IA. As such, as the pad regions are arranged in a three-dimensional manner, a semiconductor device may be highly integrated.

The upper select gate electrode GE_s may include upper select pad regions Ps, and the upper dummy gate electrode GE_d2 may include upper dummy pad regions Pd2. The upper select pad regions Ps and the upper dummy pad regions Pd2 may form upper pad regions Ps and Pd2 of the upper gate electrodes GE_s and GE_d2.

The upper pad regions Ps and Pd2 may be arranged in such a manner of being sequentially lowered in the first direction X away from the memory cell array region MA as illustrated in FIG. 6, and as illustrated in FIG. 9A, may be arranged to be located at the same level in a second direction Y perpendicular to the first direction X. The first and second directions X and Y may be parallel to the surface 103s of the substrate 103.

Among the lower gate electrodes GE_g and GE_d1, the lower select gate electrode GE_g may include a lower select pad region Pg, and the lower dummy gate electrodes GE_d1 may include lower dummy pad regions Pd1.

The floating dummy gate electrodes GE_f may include floating dummy pad regions Pf. The floating dummy pad regions Pf may be arranged in a stepwise manner to be lowered in a direction toward the memory cell array region MA. The plurality of intermediate gate electrodes GE_w may include intermediate pad regions Pw. The intermediate pad regions Pw may be arranged in a stepwise manner, to have a first step in which the intermediate pad regions are lowered in the first direction from the memory cell array region MA to the connection region IA, and to have a second step lower than the first step, to be sequentially lowered in the second direction Y, perpendicular to the first direction X.

When viewed in plan view as illustrated in FIG. 8, first boundaries PB1 between the intermediate pad regions Pw may be arranged in the first direction X, and may be substantially parallel to the second direction Y, and second boundaries PB2 between the intermediate pad regions Pw may be arranged in the second direction Y and may be substantially parallel to the first direction X.

Vertical structures VS may be disposed on the substrate 103. The vertical structures VS may include vertical memory cell structures VSc and vertical dummy structures VSd. The vertical structures VS may penetrate through the gate electrodes GE.

In some embodiments, a first insulating layer 132, a second insulating layer 163 and a third insulating layer 181 may be disposed to be sequentially stacked, while covering the gate electrodes GE, on the substrate 103. The vertical structures VS may penetrate through the gate electrodes GE while penetrating through the first insulating layer 132. The main separation structures MS and the first and second secondary separation structures SS1 and SS2 may penetrate through the gate electrodes GE while penetrating through the first and second insulating layers 132 and 163. Upper surfaces of the main separation structures MS and the first and second secondary separation structures SS1 and SS2 may be located to be higher than a level of upper surfaces of the vertical structures VS.

The vertical memory cell structures VSc may be disposed on the memory cell array region MA. A portion of the vertical dummy structures VSd may penetrate through the insulating patterns ISP on the memory cell array region MA, and the remainder thereof may be disposed between the main separation structures MS on the connection region IA. A layout density of the vertical structures VS on the memory cell array region MA may be higher than that of the vertical structures VS on the connection region IA. That is, a density of disposition of the vertical structures VS on the memory cell array region MA may be higher than a density of disposition of the vertical structures VS on the connection region IA. The density of disposition of the vertical memory cell structures VSc may be higher than that the density of disposition of the vertical dummy structures VSd.

In some embodiments, the vertical dummy structures VSd on the connection region IA may penetrate through the pad regions.

Each of the vertical structures VS may include a semiconductor pattern 145, a core pattern 157, a pad pattern 160, a channel semiconductor layer 154, and a first gate dielectric 151. A second gate dielectric 169 may be disposed to extend between the vertical memory cell structures VSc and the gate electrodes GE, while being disposed on upper and lower surfaces of the gate electrodes GE.

The semiconductor pattern 145 may be in contact with the substrate 103. In some embodiments, the semiconductor pattern 145 may be an epitaxial material layer that may be formed by an SEG process.

The core pattern 157 may be disposed on the semiconductor pattern 145, and may be formed of an insulating layer, for example, silicon oxide or the like. The pad pattern 160 may be disposed on the core pattern 157. The pad pattern 160 may be formed of polysilicon having N-type conductivity, and may be provided as a drain region. The pad pattern 160 may be disposed on a level higher than that of the gate electrodes GE.

The channel semiconductor layer 154 may extend in a direction Z perpendicular to the surface 103s of the substrate 103, while being in contact with the semiconductor pattern 145. The channel semiconductor layer 154 may cover a side of the core pattern 157, and may be in contact with the pad pattern 160. The channel semiconductor layer 154 may penetrate through the intermediate gate electrodes GE_w that may include the word lines (see WL of FIGS. 1 and 2) of the gate electrodes GE, and the upper gate electrodes GE_s and GEd that may include the string select lines (see SSL of FIGS. 1 and 2). The channel semiconductor layer 154 may be comprised of a polysilicon layer.

The first gate dielectric 151 may be disposed between the channel semiconductor layer 154 and the gate electrodes GE, while covering an external side of the channel semiconductor layer 154.

One of the first and second gate dielectrics 151 and 169 may include a layer in which information may be stored. For example, the first gate dielectric 151 may include a layer in which information may be stored; however, embodiments of the present inventive concept are not limited thereto. For example, the second gate dielectric 169 may include a layer in which information may be stored. An example in which the first gate dielectric 151 having a layer that may store information therein will be described below.

The first gate dielectric 151 may include a tunnel dielectric layer 148, an data storage layer 147, and a blocking dielectric layer 146. The data storage layer 147 may be disposed between the tunnel dielectric layer 148 and the blocking dielectric layer 146. The tunnel dielectric layer 148 may be adjacent to the channel semiconductor layer 154, and the blocking dielectric layer 146 may be adjacent to the gate electrodes GE.

The tunnel dielectric layer 148 may include a silicon oxide and/or an impurity-doped silicon oxide. The blocking dielectric layer 146 may include a silicon oxide and/or a high-k dielectric.

The data storage layer 147 may be interposed between the channel semiconductor layer 154 and the intermediate gate electrodes GE_w of the gate electrodes GE, and may be a layer to store information in a nonvolatile memory device such as a flash memory device or the like. For example, the data storage layer 147 may be formed of a material capable of trapping electrons injected from the channel semiconductor layer 154 via the tunnel dielectric layer 148 to retain the trapped electrons, or capable of erasing trapped electrons from the data storage layer 147, according to operating conditions of a non-volatile memory device such as a flash memory device or the like, for example, may be formed of a silicon nitride. The second gate dielectric 169 may include a high-k dielectric, for example, AlO or the like.

The data storage layer 147 may store information in regions opposing the intermediate gate electrodes GE_w corresponding to the word lines (see WL of FIGS. 1 and 2), among the gate electrodes GE. In the data storage layer 147 within a one cell vertical structure among the vertical memory cell structures VSc, regions storing information may be arranged in a direction perpendicular to a surface of the substrate 103, and may be defined as the memory cells (see MC of FIG. 2). Thus, the vertical memory cell structures VSc may configure the memory strings (see S of FIG. 2) described above with reference to FIG. 2, and the vertical dummy structures VSd may configure the dummy string (see DS of FIG. 2) described above with reference to FIG. 2.

Bit line contact plugs 182 may be disposed on the vertical memory cell structures VSc.

Contact plugs 184 may be disposed on pad regions of the gate electrodes GE. The contact plugs 184 may include a lower select contact plug 184g electrically connected to the lower select pad region Pg of the lower select gate electrode GE_g, intermediate contact plugs 184w electrically connected to the intermediate pad regions Pw of the plurality of intermediate gate electrodes GE_w, an upper select contact plug 184s electrically connected to the upper select pad region Ps of the upper select gate electrode GE_s, and dummy contact plugs 184d on the lower and upper dummy pad regions Pd1 and Pd2 and the floating pad regions Pf.

Figure 10:
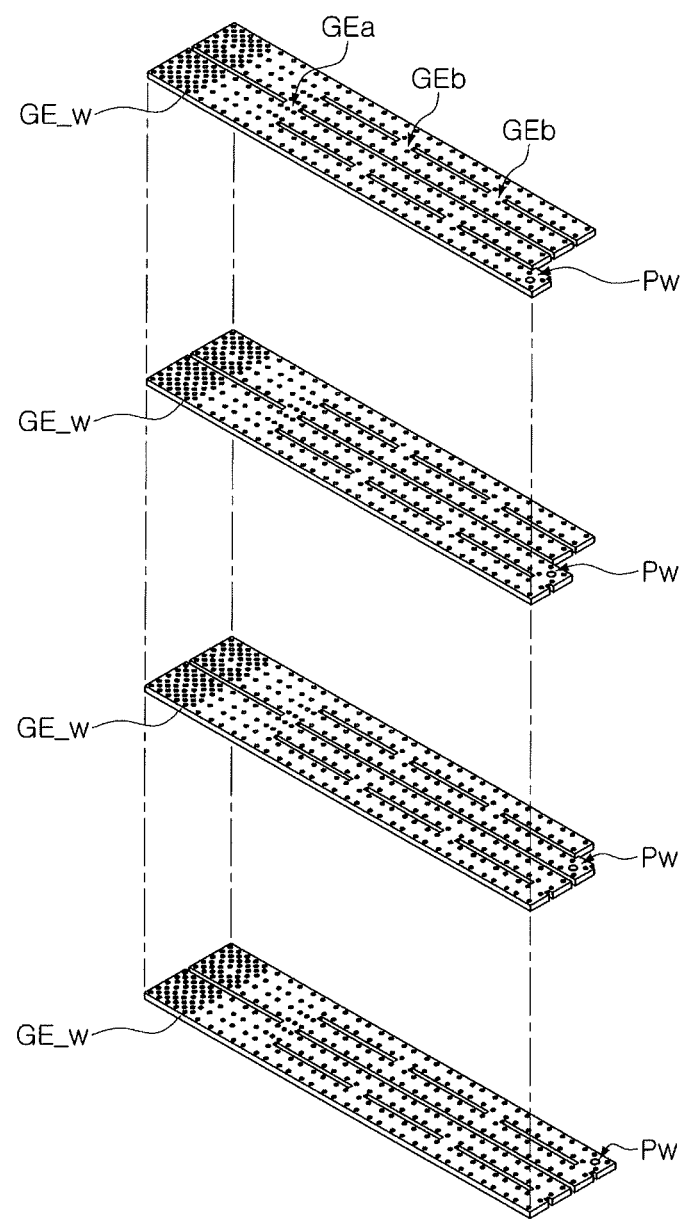
FIG. 10 is a perspective view of an example of gate electrodes of a three-dimensional semiconductor device according to some embodiments of the present inventive concept.

With reference to FIG. 10, an example of the gate electrodes GE will be described below. FIG. 10 is a perspective view of the plurality of intermediate gate electrodes GE_w among the gate electrodes GE.

With reference to FIG. 10, as described above, the plurality of intermediate gate electrodes GE_w may include pad regions Pw sequentially lowered in the second direction y as described with reference to FIG. 8. The pad regions Pw may include contact regions in contact with the contact plugs.

The plurality of intermediate gate electrodes GE_w may include a first gate connection portion GEa disposed between end portions, opposing each other, of the first and second linear portions (see SS1a and SS1b of FIGS. 5 and 8) of the first secondary separation structures (see SS1 of FIGS. 5 and 8), and second gate connection portions GEb disposed between end portions, opposing each other, of the second secondary separation structures (see SS2 of FIGS. 5 and 8). The second gate connection portions GEb may be closer to the main separation structures MS, than the first gate connection portion GEa, adjacent thereto.

A gate electrode including the first and second gate connection portions GEa and GEb may be provided as the plurality of intermediate gate electrodes GE_w and the lower select gate electrode GE_g. In some embodiments, the upper select gate electrode GE_s may not include the first and second gate connection portions GEa and GEb.

Figure 11:
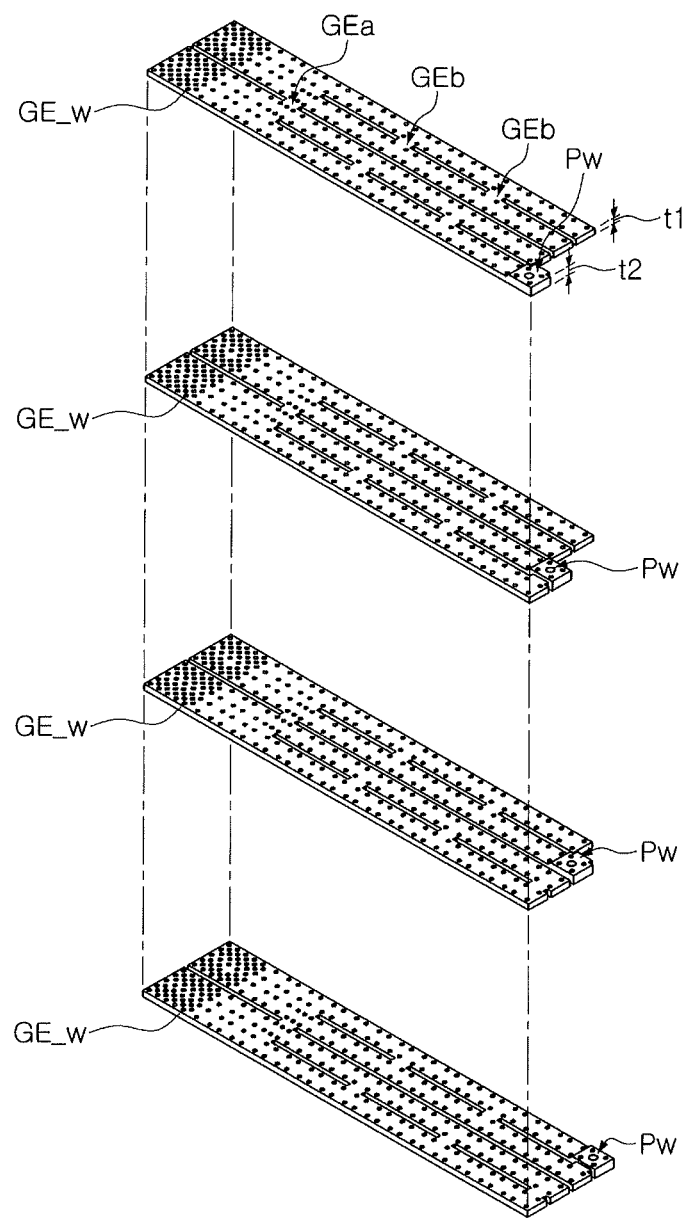
FIG. 11 is a perspective view of a modified example of gate electrodes of a three-dimensional semiconductor device according to some embodiments of the present inventive concept.

In some embodiments, the pad regions of the gate electrodes GE may have the same thickness as that of the gate electrodes GE; however, embodiments of the present inventive concept are not limited thereto. For example, the gate electrodes GE may be modified to include pad regions having an increased thickness as compared with a thickness of the gate electrodes GE, in the connection region IA. As illustrated in FIG. 11, illustrating a perspective view of a modified example of the gate electrodes GE as described above, the intermediate gate electrodes GE_w of the gate electrodes GE may have a first thickness t1, and the intermediate pad regions Pw of the intermediate gate electrodes GE_w may have a second thickness t2 greater than the first thickness t1.

Figure 12:
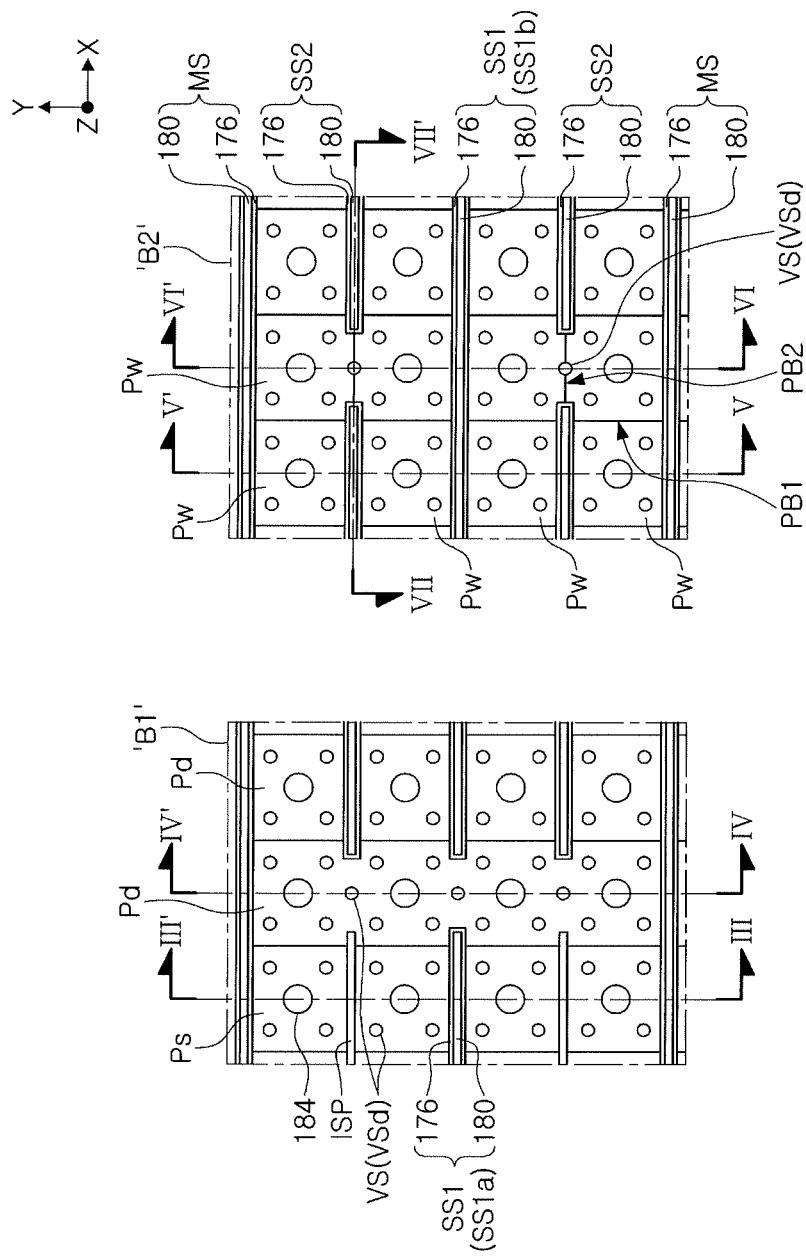
FIG. 12 provides enlarged plan views of portions 'B1' and 'B2' of FIGS. 4 and 5, in a modified example of a three-dimensional semiconductor device according to some embodiments of the present inventive concept.
Figure 13A:
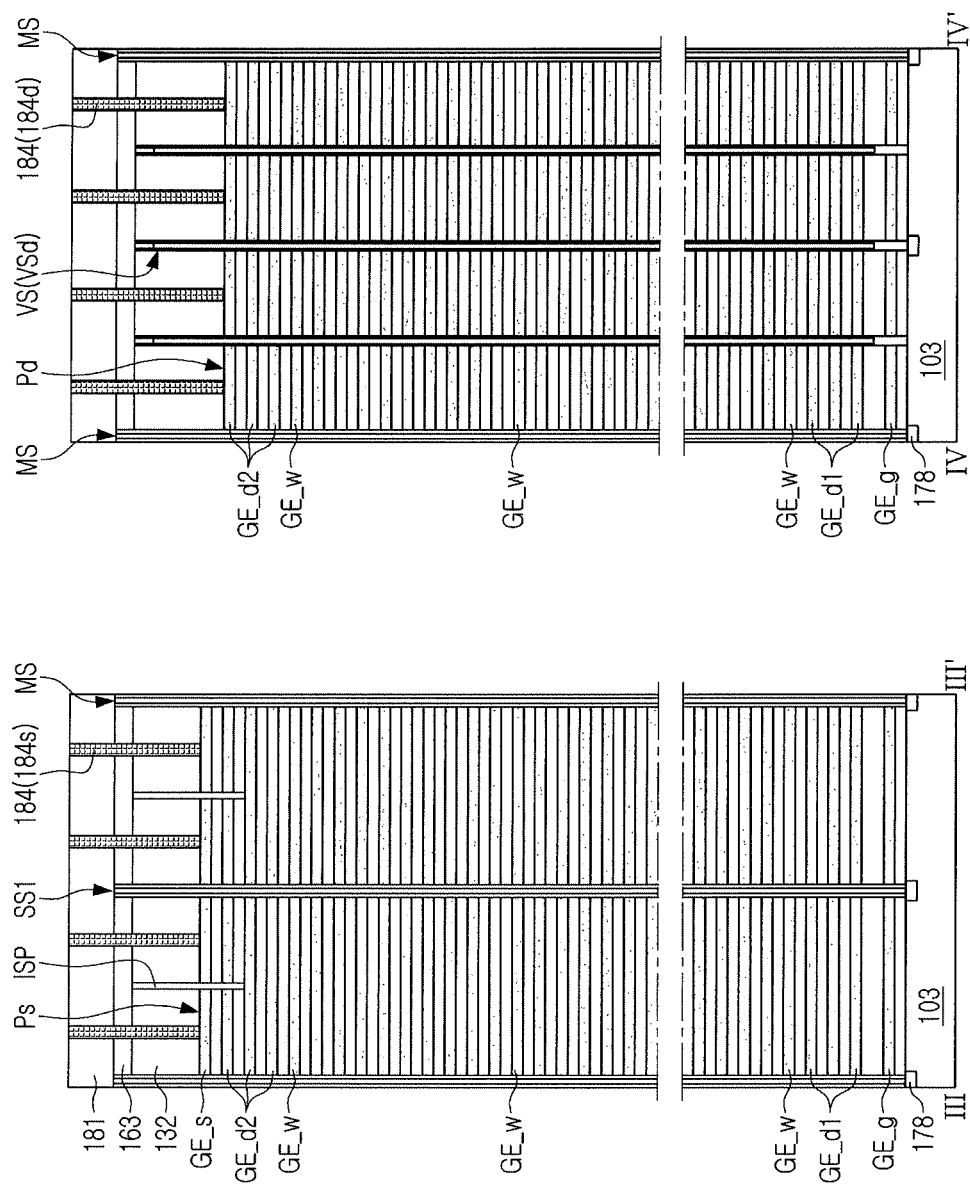
FIG. 13A provides cross-sections of regions taken along lines III-III' and IV-IV' of FIG. 12.
Figure 13B:
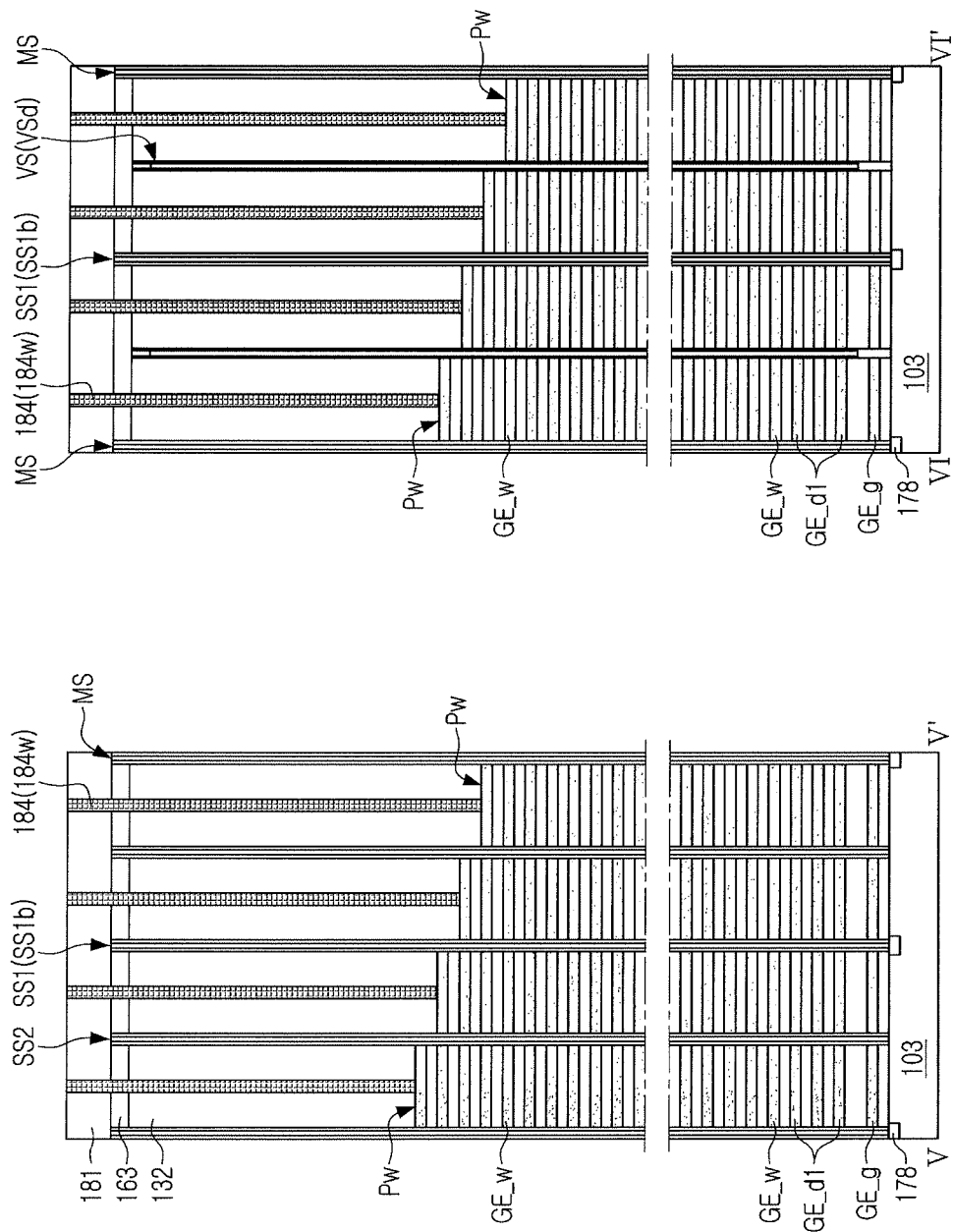
FIG. 13B provides cross-sections of regions taken along lines V-V' and VI-VI' of FIG. 12.
Figure 13C:
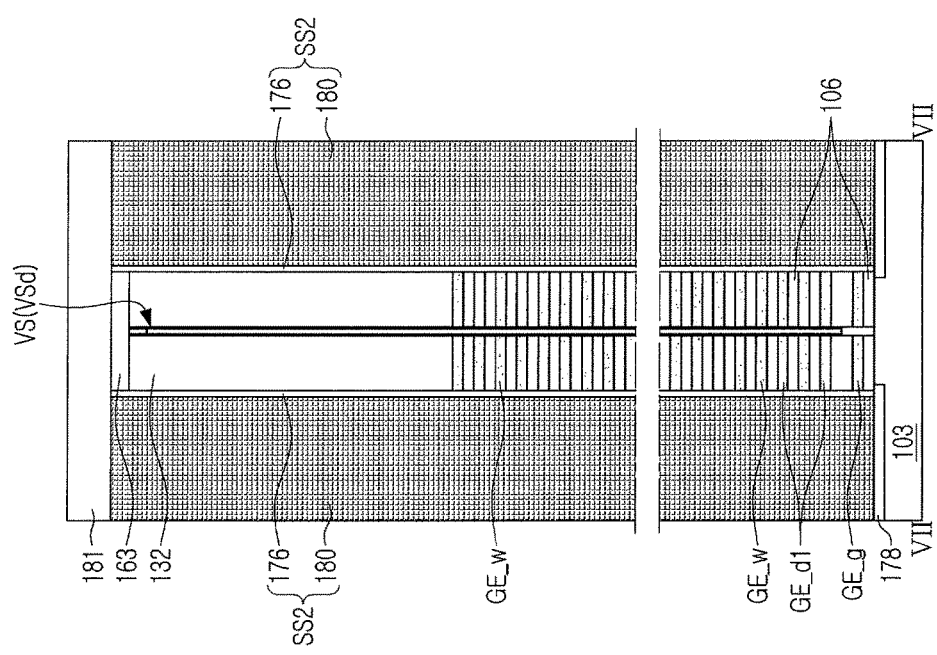
FIG. 13C is a cross-section of a region taken along line VII-VII' of FIG. 12.

In some embodiments, the vertical dummy structures VSd may be disposed to be spaced apart from boundaries between the pad regions Ps, Pd and Pw, and may not be disposed between end portions, opposing each other, of the first and second linear portions SS1a and SS1b of the first secondary separation structures SS1, and/or between end portions, opposing each other, of the second secondary separation structures SS2, however, embodiments of the present inventive concept are not limited thereto. Modified examples of the vertical dummy structures VSd will be described below with reference to FIGS. 12, 13A, 13B and 13C. FIG. 12 provides enlarged plan views of portions 'B1' and 'B2' of FIGS. 4 and 5, in a modified example of the three-dimensional semiconductor device according to some embodiments. FIG. 13A provides cross-sections of regions taken along lines III-III' and IV-IV' of FIG. 12, FIG. 13B provides cross-sections of regions taken along lines V-V' and VI-VI' of FIG. 12, and FIG. 13C is a cross-section of a region taken along line VII-VII' of FIG. 12.

Referring to FIGS. 12, 13A, 13B and 13C, in the connection region IA, a portion of vertical dummy structures VSd may be disposed between end portions, opposing each other, of the first and second linear portions SS1a and SS1b of the first secondary separation structures SS1, and/or between end portions, opposing each other, of the second secondary separation structures SS2. In this case, the end portions, opposing each other, of the first and second linear portions SS1a and SS1b of the first secondary separation structures SS1, and the end portions, opposing each other, of the second secondary separation structures, may be end portions arranged in the first direction X.

In some embodiments, a portion of the vertical dummy structures VSd may be arranged in the second direction Y, and may be disposed on the second boundary PB2 between the intermediate pad regions Pw that may be disposed in parallel to the first direction X.

Figure 14:
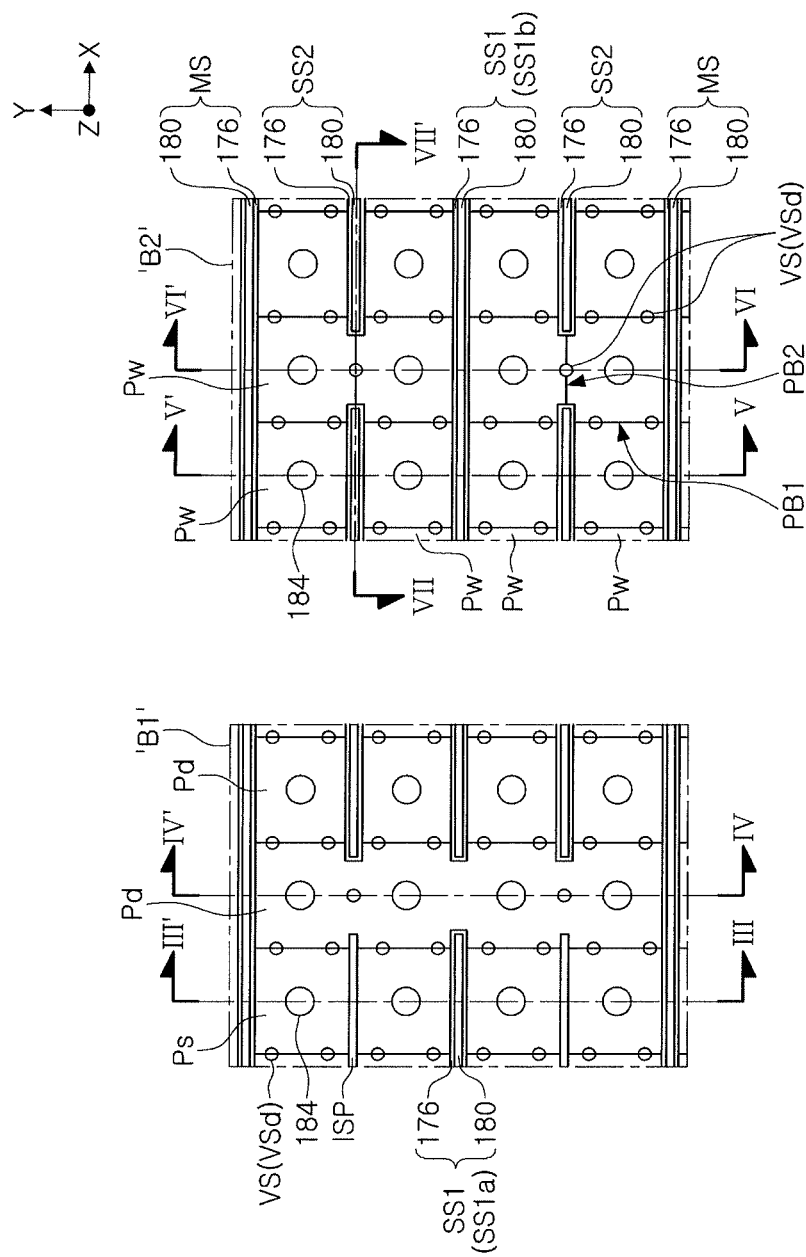
FIG. 14 provides enlarged plan views of portions 'B1' and 'B2' of FIGS. 4 and 5, in another modified example of a three-dimensional semiconductor device according to some embodiments of the present inventive concept.

In some embodiments, the vertical dummy structures VSd may be arranged in the first direction X, and may be spaced apart from the first boundary PB1 between the intermediate pad regions Pw that may be disposed in parallel to the second direction Y; however, embodiments thereof are not limited thereto. As illustrated in FIG. 14, a portion of the vertical dummy structures VSd may be arranged in the first direction X, and may penetrate through the first boundary PB1 between the intermediate pad regions Pw parallel to the second direction Y. Thus, with reference to FIG. 14, a portion of the vertical dummy structures VSd may penetrate through the first and second gate connection portions (see GEa and GEb of FIG. 10) of the intermediate gate electrodes (see GE_w of FIG. 10).

Figure 15:
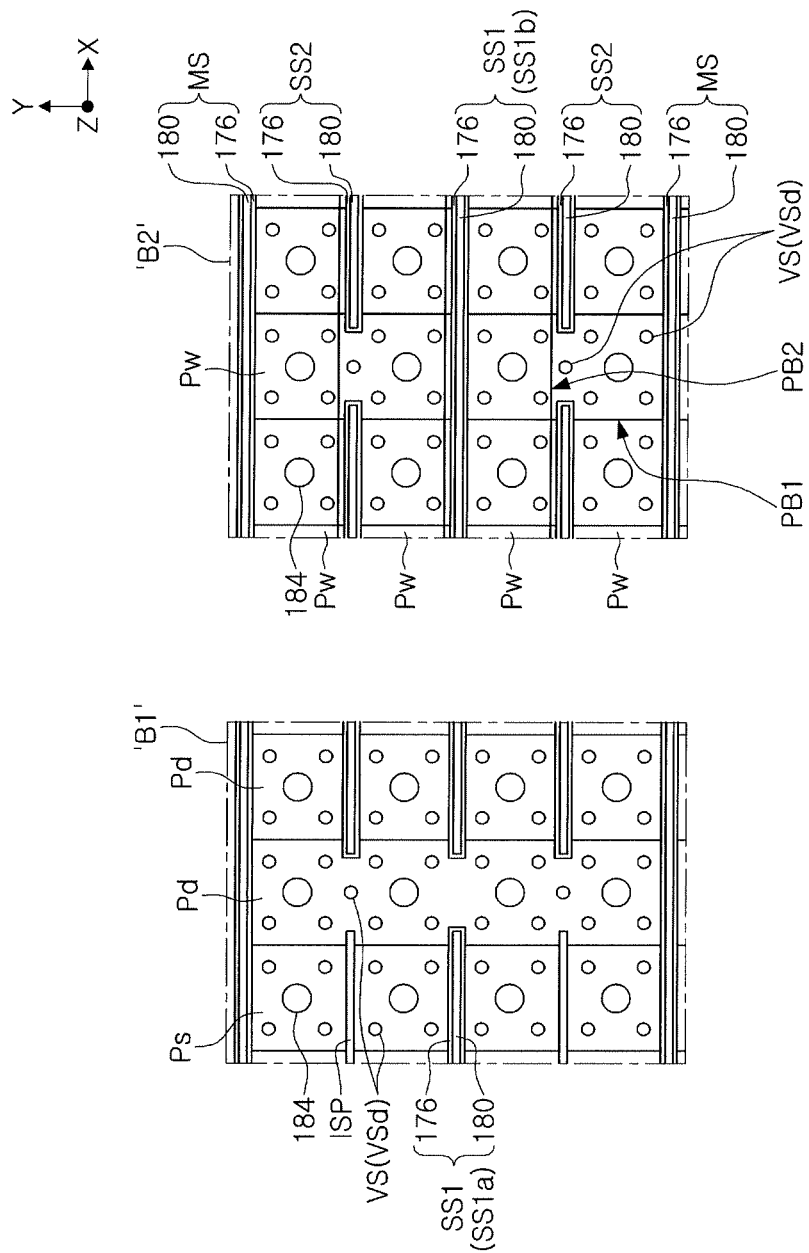
FIG. 15 provides enlarged plan views of portions 'B1' and 'B2' of FIGS. 4 and 5, in another modified example of a three-dimensional semiconductor device according to some embodiments of the present inventive concept.
Figure 16:
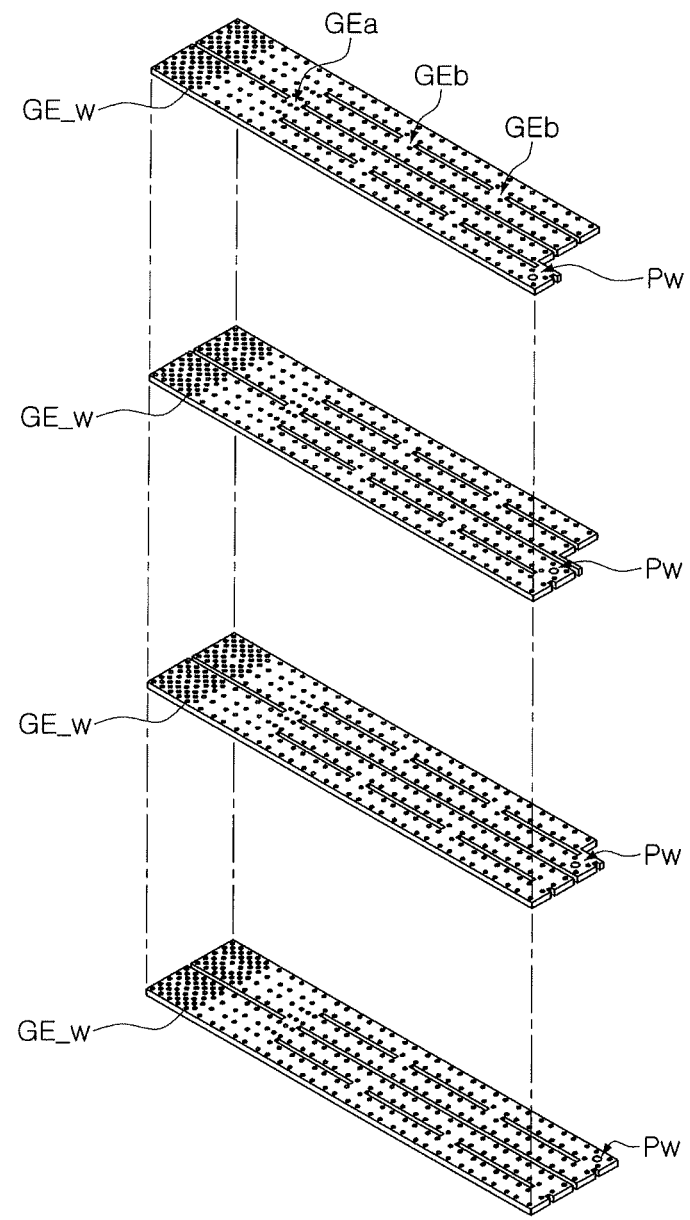
FIG. 16 is a perspective view of another modification of gate electrodes of a three-dimensional semiconductor device according to some embodiments of the present inventive concept.

In some embodiments, the second boundary PB2 arranged in the second direction Y and provided between the intermediate pad regions Pw parallel to the first direction X may be disposed between end portions of the secondary separation structures SS1 and SS2, opposing each other, however, embodiments thereof are not limited thereto. With reference to FIGS. 15 and 16, the intermediate pad regions Pw arranged in the second direction Y will be described below.

FIG. 15 provides enlarged plan views of portions 'B1' and 'B2' of FIGS. 4 and 5, in another modified example of the three-dimensional semiconductor device according to some embodiments. FIG. 16 is a perspective view of another modified example of the gate electrodes GE of the three-dimensional semiconductor device according to some embodiments.

Referring to FIGS. 15 and 16, when viewed in the plan view as illustrated in FIG. 15, the second boundary PB2 between the intermediate pad regions Pw arranged in the second direction Y may not overlap the first and second secondary separation structures SS1 and SS2.

Figure 17:
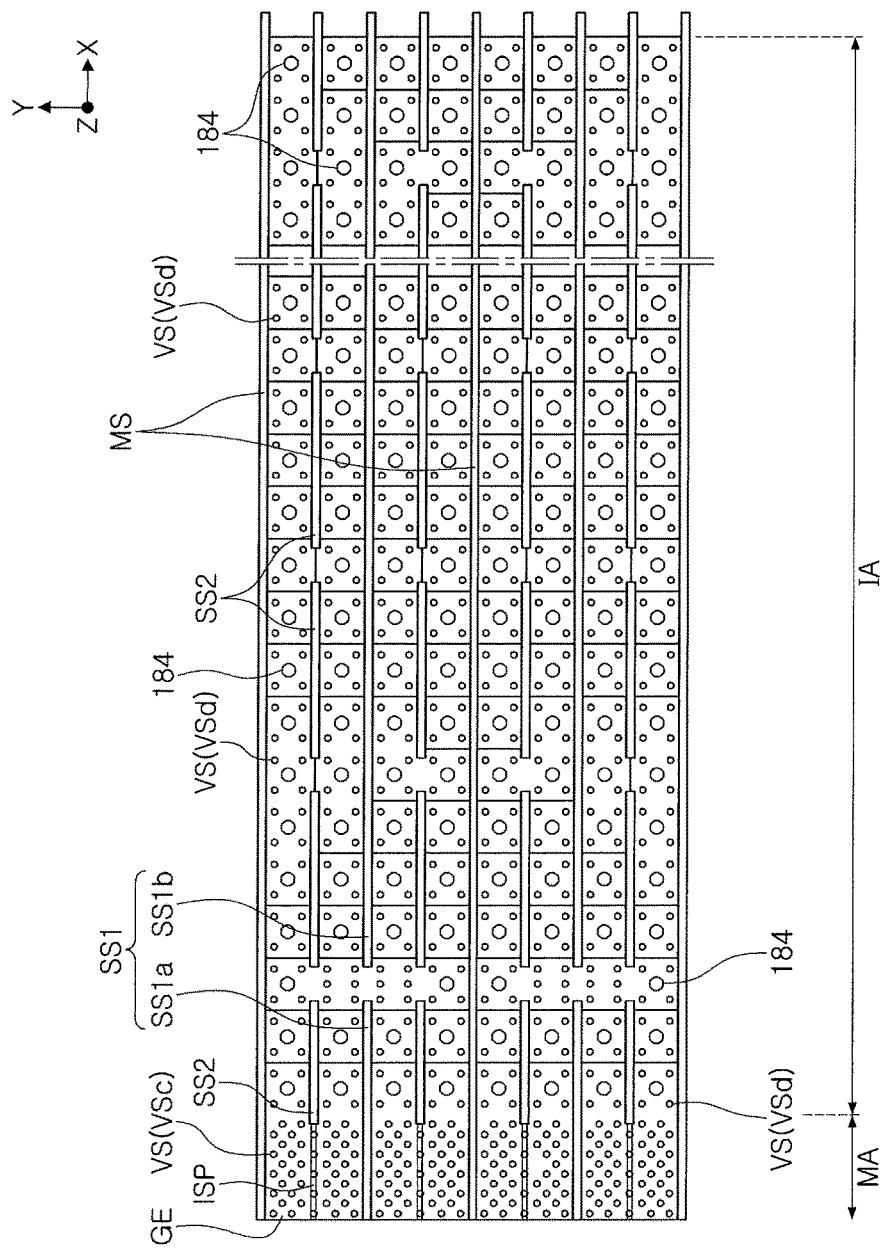
FIG. 17 is a plan view of another modification of a three-dimensional semiconductor device according to some embodiments of the present inventive concept.

According to some embodiments, the insulating linear pattern ISP may be disposed above the plurality of intermediate gate electrodes GE_w, and may penetrate through the upper select gate electrode GE_s while traversing the upper select gate electrode GE_s. The insulating linear pattern ISP may extend to the connection region IA, while traversing the upper select gate electrode GE_s on the memory cell array region MA, in such a manner that the insulating linear pattern may pass between the upper select pad regions Ps, however, embodiments thereof are not limited thereto. For example, as illustrated in the plan view of FIG. 17 in another modified example of the three-dimensional semiconductor device according to some embodiments, the insulating linear pattern ISP may traverse the upper select gate electrode GE_s in the memory cell array region MA, and the second secondary separation structures SS2 may be disposed between the upper select pad regions Ps.

Substantially, an example of a method of manufacturing a three-dimensional semiconductor device according to some embodiments will be described with reference to FIGS. 18A to 22B. FIGS. 18A, 19A, 20A, 21A and 22A are cross-sections of a region taken along line I-I' of FIG. 5, and FIGS. 18B, 19B, 20B, 21B and 22B are cross-sections of a region taken along line VIII-VIII' of FIG. 5.

Figure 18A:
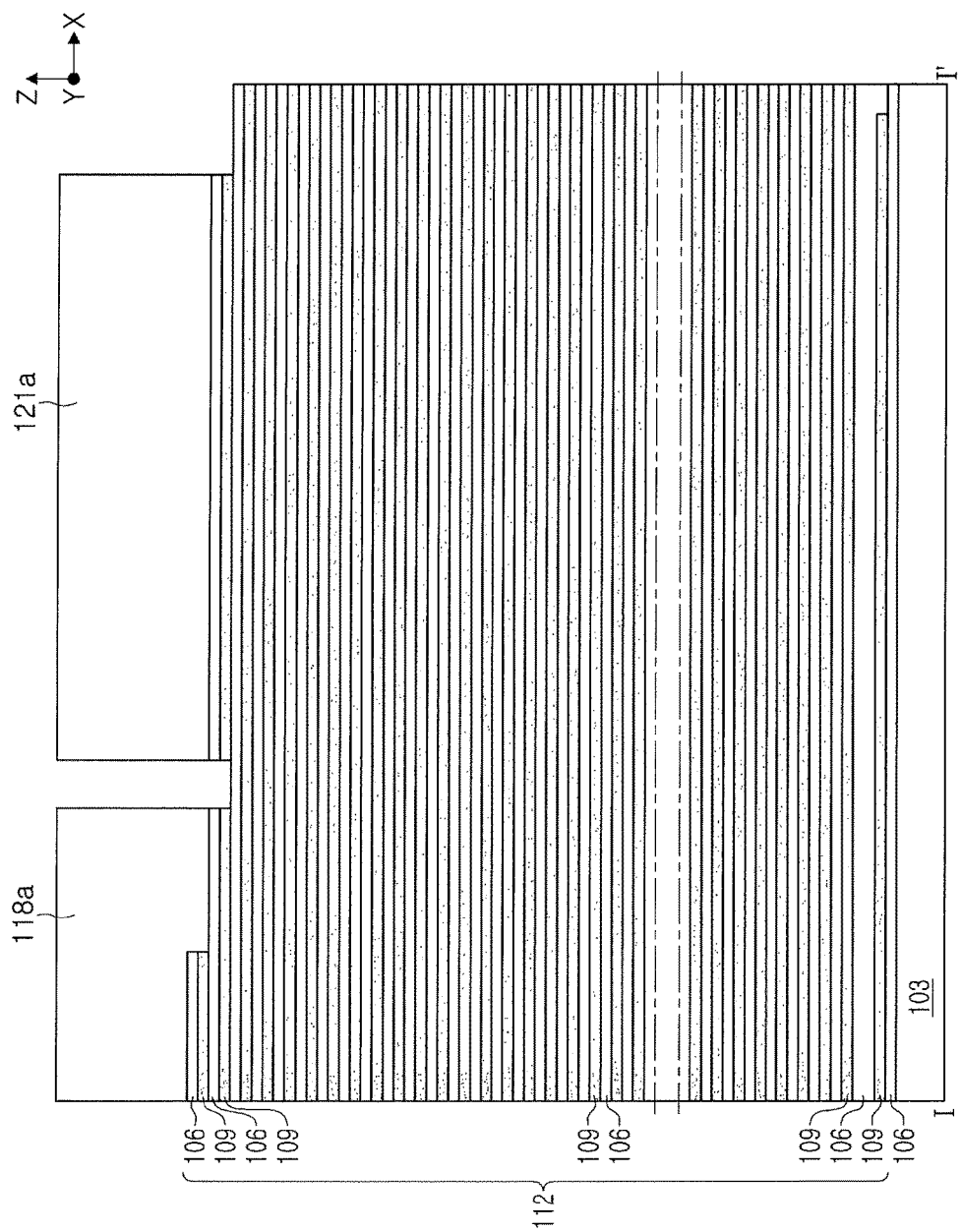
FIGS. 18A to 22B are cross-sections illustrating processing steps in the fabrication of three-dimensional semiconductor devices according to some embodiments of the present inventive concept.
Figure 18B:
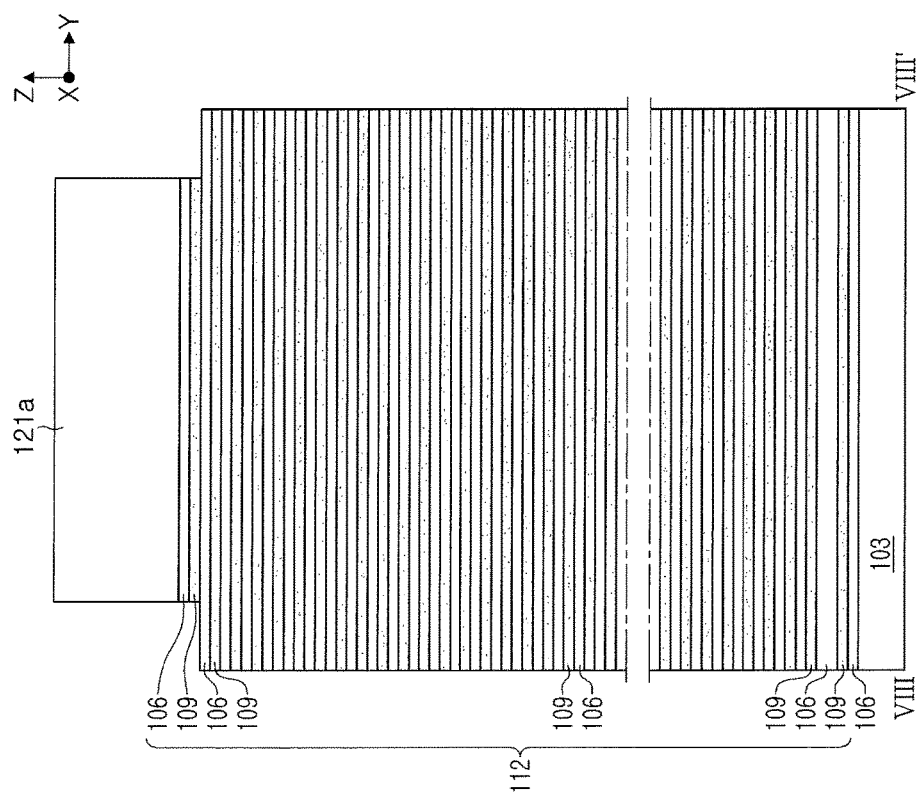

Referring to FIGS. 5, 18A and 18B, a molding structure 112, including interlayer insulating layers 106 and sacrificial layers 109, may be formed on a surface 103s of a substrate 103 having a memory cell array region MC and a connection region IA. The interlayer insulating layers 106 may be formed of silicon oxide, and the sacrificial layers 109 may be formed of silicon oxide.

The interlayer insulating layers 106 and the sacrificial layers 109 may be formed alternately and repeatedly, and a lowermost layer and an uppermost layer thereof may be interlayer insulating layers. Among the sacrificial layers 109, a lowermost sacrificial layer and an uppermost sacrificial layer may be patterned sacrificial layers.

A first mask pattern 118a and a second mask pattern 121a, spaced apart from each other, may be formed on the substrate 103 provided with the interlayer insulating layers 106 and the sacrificial layers 109.

In some embodiments, the first mask pattern 118a may cover the entirety of the memory cell array region MA to extend over a portion of the connection region IA. The first mask pattern 118a may cover a patterned sacrificial layer located on an uppermost position, among the sacrificial layers 109. The second mask pattern 121a may be formed on a portion of the connection region IA.

In some embodiments, a single second mask pattern 121a may be formed to have a quadrangular form on one pair of memory blocks BLK adjacent to each other among the memory blocks BLK. The first and second mask patterns 118a and 121a may be formed using photoresist patterns.

Among the interlayer insulating layers 106 and the sacrificial layers 109, one interlayer insulating layer and one sacrificial layer, not overlapping the first and second mask patterns 118a and 121a, may be sequentially etched by using the first and second mask patterns 118a and 121a as an etching mask.

Figure 19A:
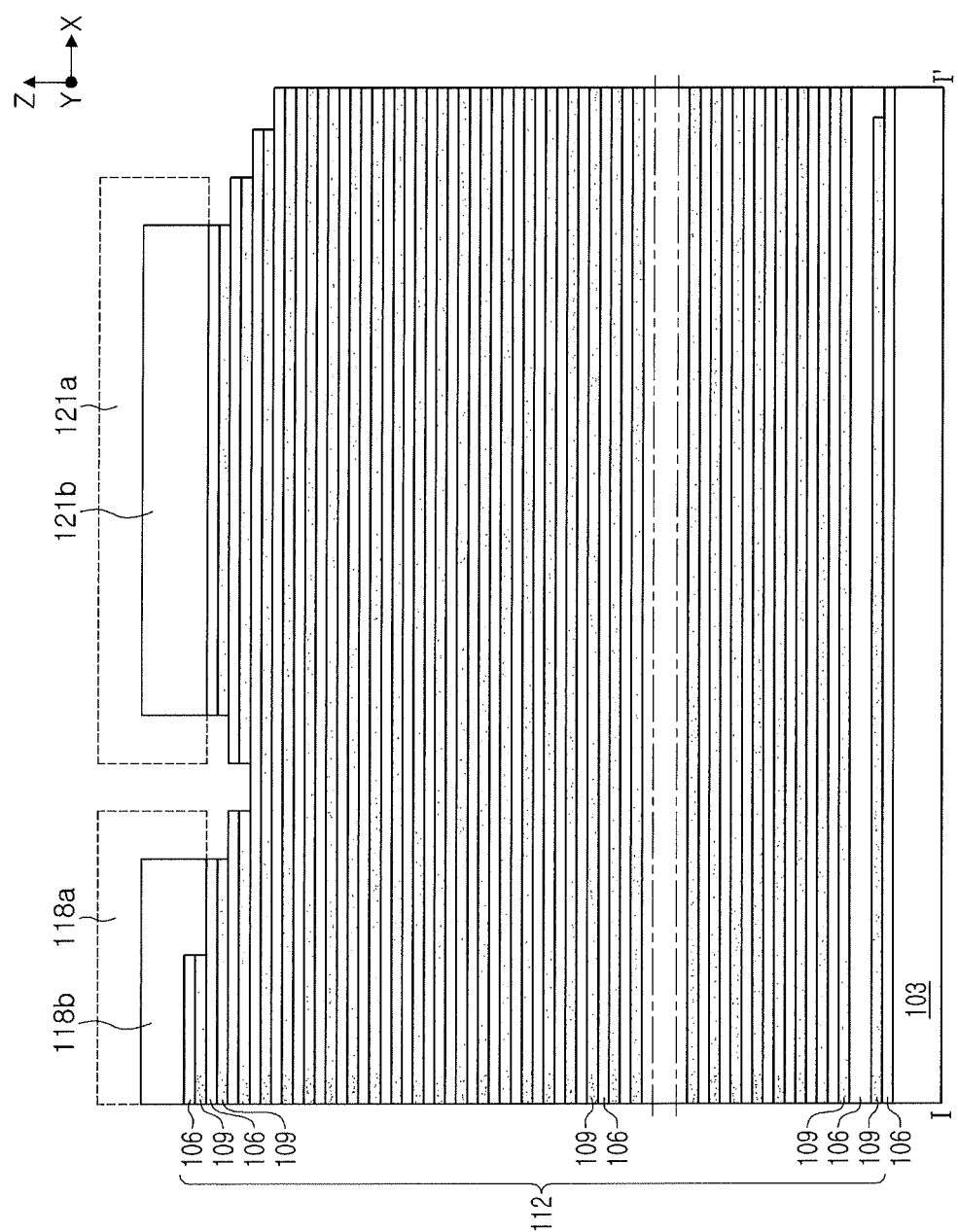
Figure 19B:
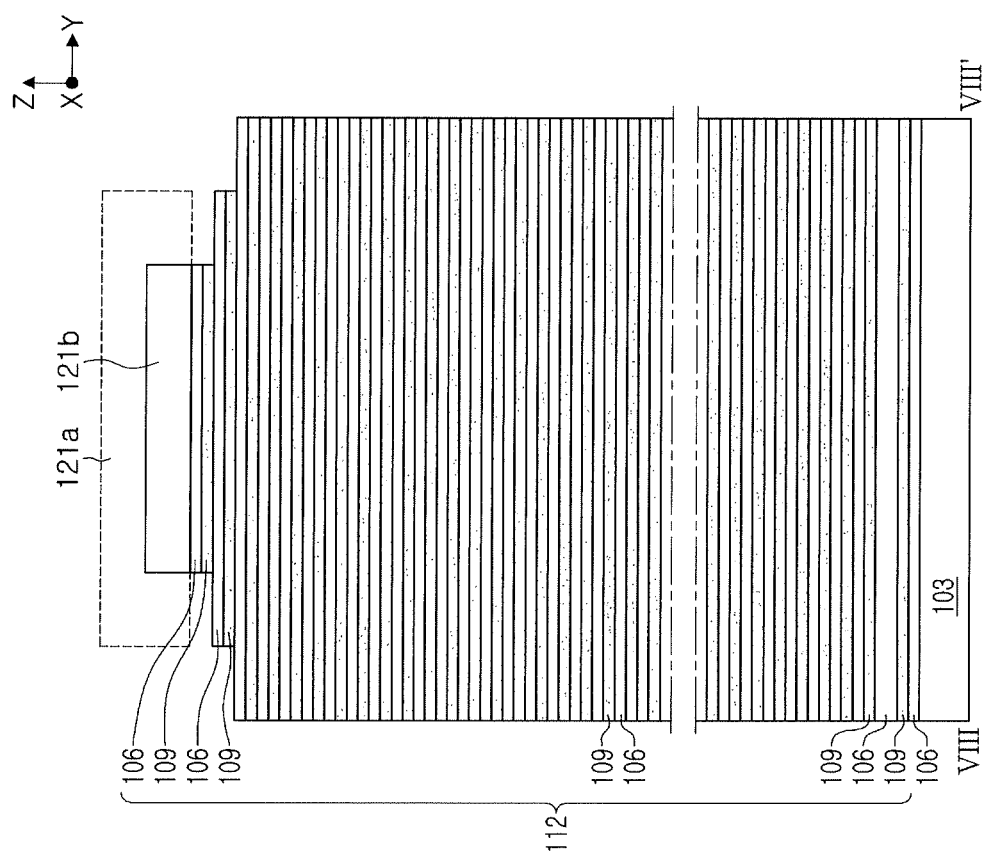

Referring to FIGS. 5, 19A and 19B, a first trimming process may be performed to reduce the size of the first and second mask patterns (see 118a and 121a of FIGS. 18A and 18B). The first trimming process may be a partial etching process or an isotropic etching process, to reduce the size of the first and second mask patterns (see 118a and 121a of FIGS. 18A and 18B) in a direction parallel to the surface of the substrate 103. Thus, among the interlayer insulating layers 106 and the sacrificial layers 109, one interlayer insulating layer and one sacrificial layer, not overlapping first and second mask patterns 118b and 121b, may be sequentially etched using the first and second mask patterns 118b and 121b, having been reduced in size by the first trimming process.

Figure 20A:
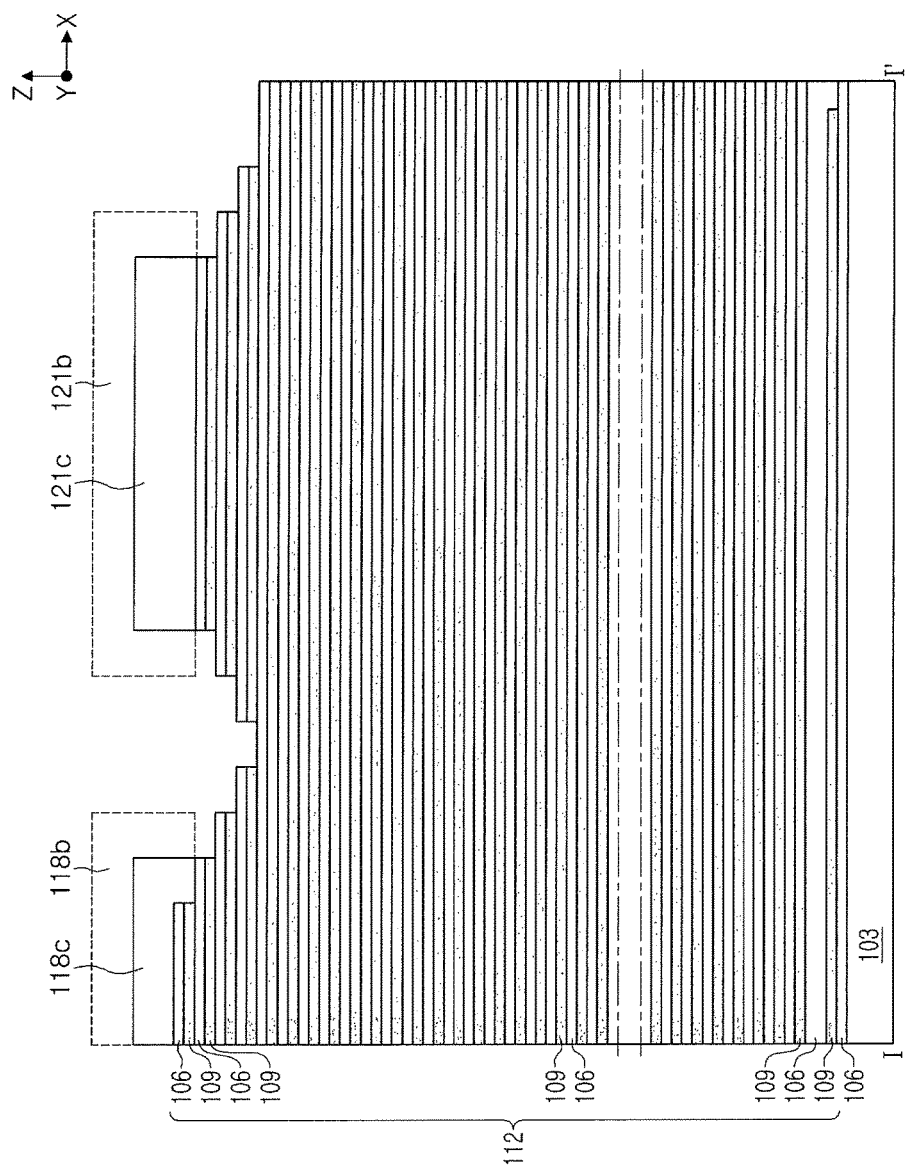
Figure 20B:
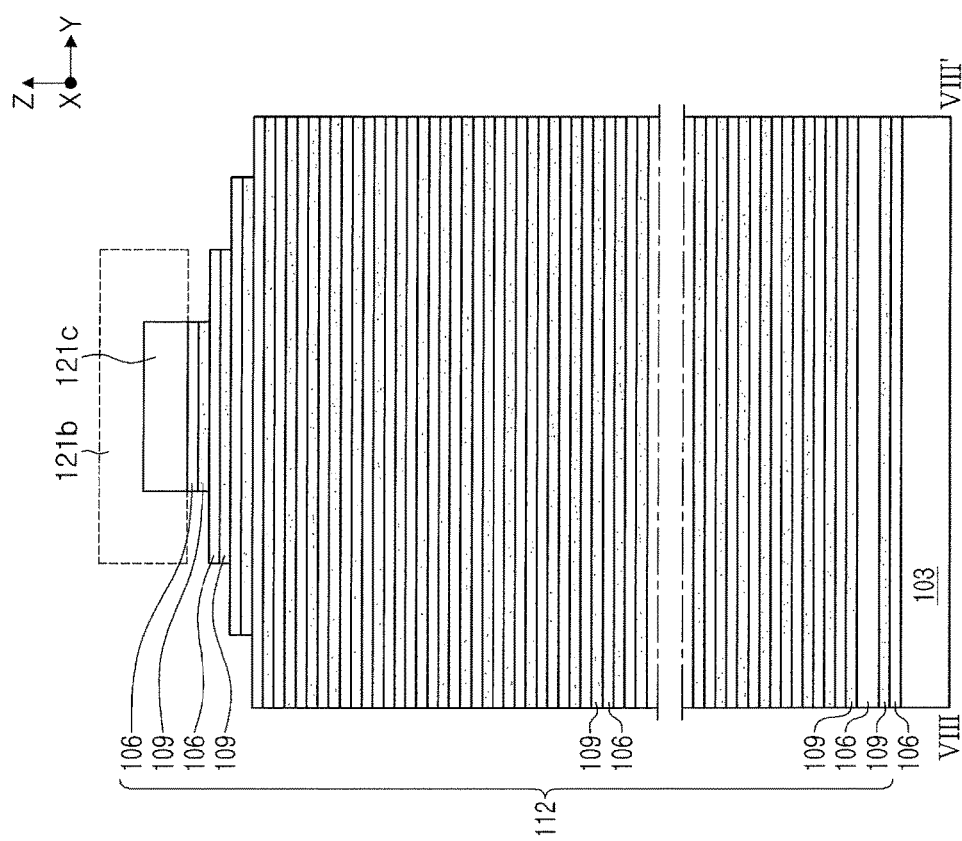

With reference to FIGS. 5, 20A and 20B, a second trimming process may be performed to further reduce the size of the first and second mask patterns (see 118b and 121b of FIGS. 19A and 19B). The second trimming process may be a partial etching process or an isotropic etching process, to reduce the size of the first and second mask patterns (see 118b and 121b of FIGS. 19A and 19B) in a direction parallel to the surface of the substrate 103.

Thus, among the interlayer insulating layers 106 and the sacrificial layers 109, one interlayer insulating layer and one sacrificial layer, not overlapping first and second mask patterns 118c and 121c, may be sequentially etched using the first and second mask patterns 118c and 121c, having been reduced in the size by the second trimming process.

Figure 21A:
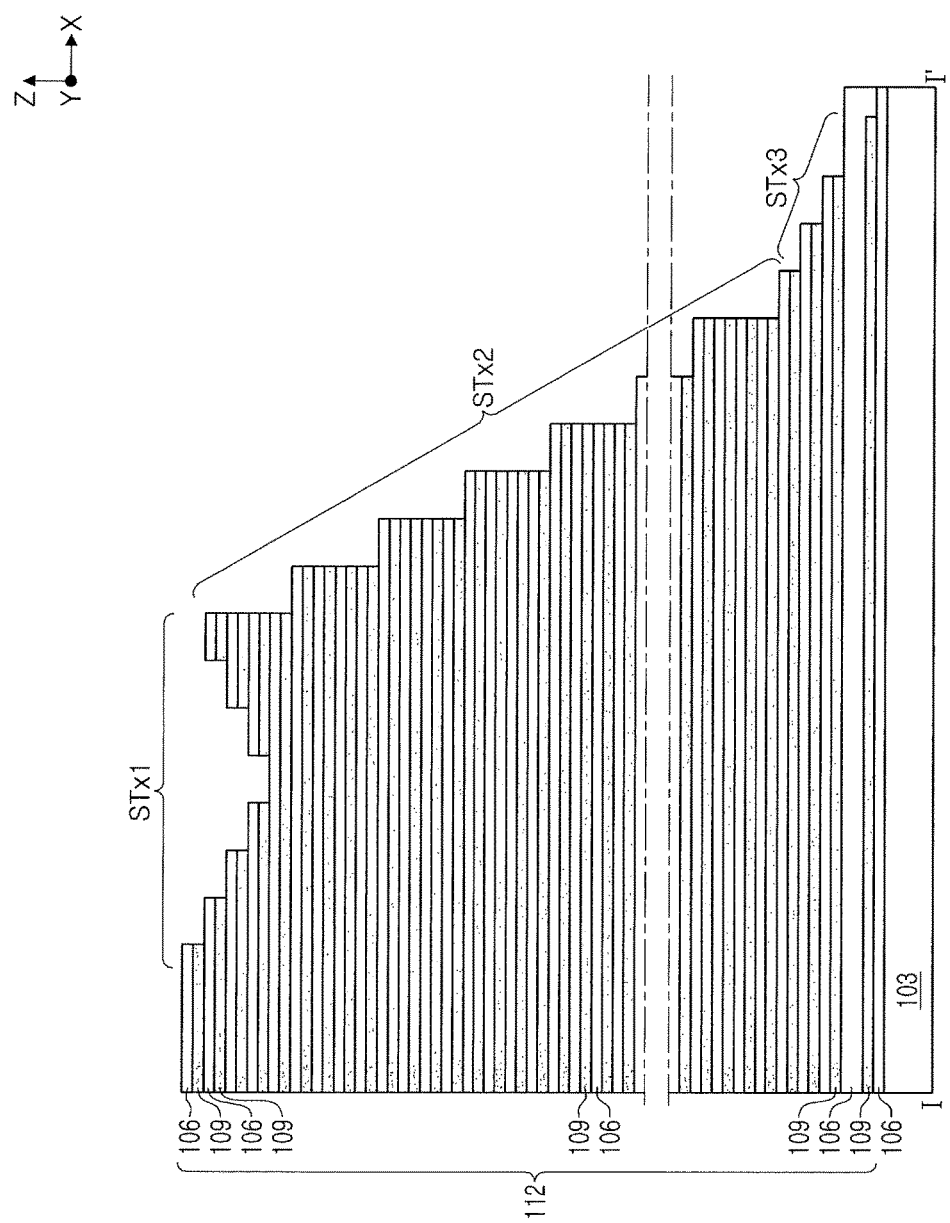

Referring to FIGS. 5, 21A and 21B, after the first and second mask patterns (see 118c and 121c of FIGS. 20A and 20B) are removed, a step process may be performed, such that steps lowered to have a predetermined height may be formed in a region from which the second mask pattern 121c has been removed. Thus, steps STx2 lowered in a first direction X to have a first step, steps STx1 and STx3 lowered in the first direction X to have a second step, having a height lower than that of the first step, and steps Sty and Sty, lowered in a second direction Y, perpendicular to the first direction X, to have the second step, may be formed.

Figure 22A:
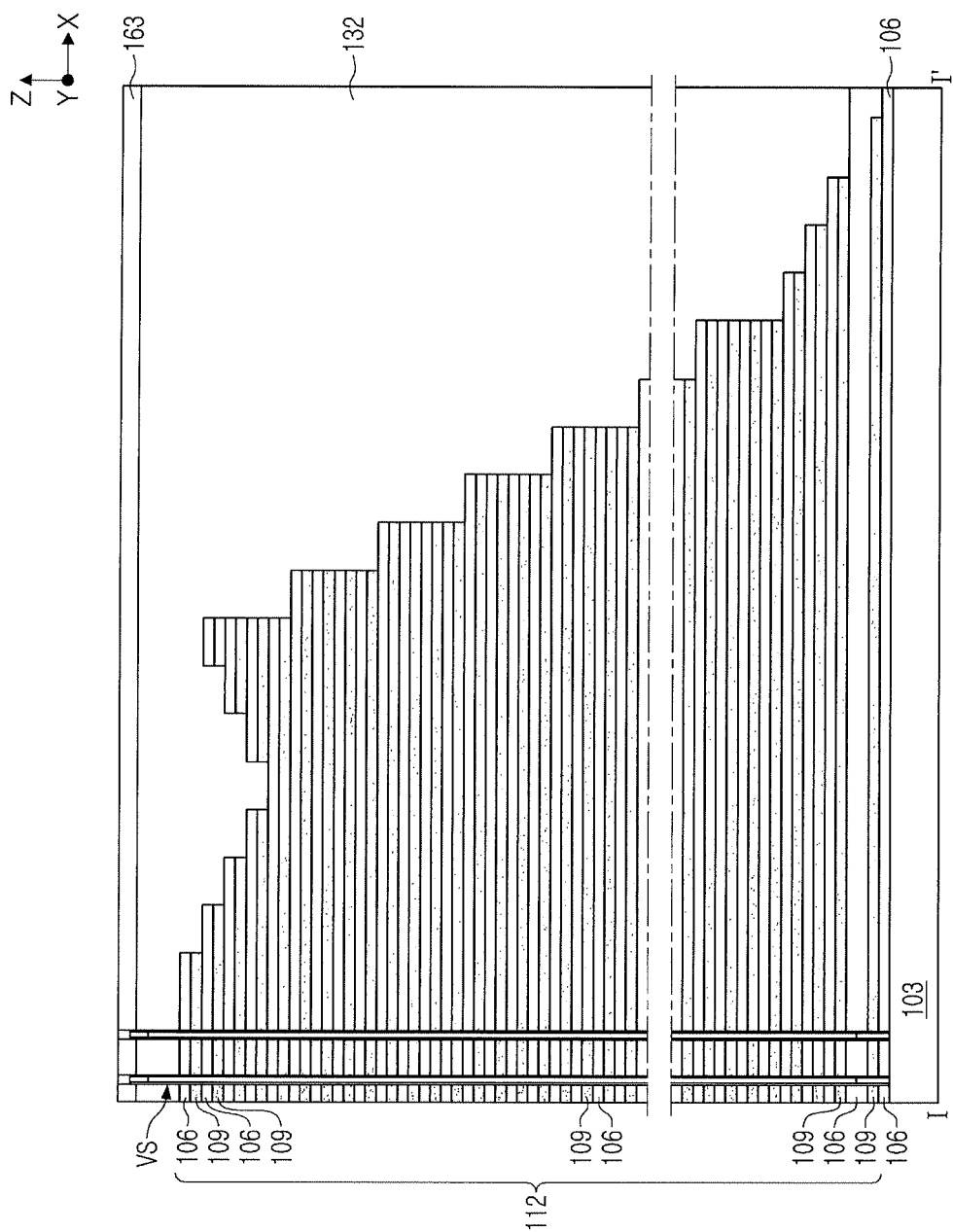

With reference to FIGS. 5, 22A and 22B, a first insulating layer 132 may be formed on the molding structure 112. Insulating linear patterns (see ISP of FIG. 7) may be formed to penetrate through the first insulating layer 132 and an uppermost sacrificial layer and a second uppermost sacrificial layer among the sacrificial layers 109 of the molding structure 112.

In a modified example, before the first insulating layer 132 is formed, an uppermost interlayer insulating layer among the interlayer insulating layers 106 may be removed to expose the sacrificial layers 109. Subsequently, the same material as that of the sacrificial layers may be formed on sacrificial layers that may correspond to the pad regions described above, among the sacrificial layers 109, thereby increasing thicknesses of the sacrificial layers. As such, the portions of the sacrificial layers having an increased thickness may be portions for formation of the pad regions (see Pw of FIG. 11) with an increased thickness described above with reference to FIG. 11.

Vertical structures VS may be formed to penetrate through the first insulating layer 132 and the molding structure 112. The vertical structures VS may be formed to have the same structure as that described above with reference to FIG. 7.

The first insulating layer 132 and a second insulating layer 163 covering the vertical structures VS, may be formed.

The first and second insulating layers 132 and 163, and trenches 166 penetrating through the molding structure 112, may be formed. The sacrificial layers 109 of the molding structure 112 may be exposed by sidewalls of the trenches 166.

The trenches 166 may be formed to have a planar shape corresponding to the main separation structures (see MS of FIGS. 3 and 4) and the first and second secondary separation structures (see SS1 and SS2 of FIGS. 3 and 4) described above with reference to FIGS. 3 and 4.

Referring again to FIGS. 4 to 8, 9A, 9B and 9C, a gate replacement process of replacing the sacrificial layers (see 109 of FIGS. 22A and 22B) exposed by the trenches (see 166 of FIGS. 22A and 22B) with gates may be performed. For example, the sacrificial layers (see 109 of FIGS. 22A and 22B) exposed by the trenches (see 166 of FIGS. 22A and 22B) may be removed to form empty spaces, a second gate dielectric 169 may be formed to cover inner walls of the empty spaces, and gate electrodes GE may be formed to fill the empty spaces of which the inner walls have been covered with the second gate dielectric 169.

Subsequently, insulating spacers 176 may be formed on sides of the trenches (see 166 of FIGS. 22A and 22B), and impurity regions 178 may be formed in the substrate 103 exposed by the trenches (see 166 of FIGS. 22A and 22B), and conductive patterns 180 may be formed to fill the trenches (see 166 of FIGS. 22A and 22B). The insulating spacers 176 and the conductive patterns 180 may configure the main separation structures MS and the first and second secondary separation structures SS1 and SS2. Subsequently, an insulating material may be formed to cover the separation structures MS, SS1 and SS2 and the second insulating layer 163, and then, a contact and wiring formation process may be performed.

As described above, the gate electrodes GE may include pad regions arranged in a three-dimensional manner. Such three-dimensionally arranged pad regions may improve a degree of integration of semiconductor device. Furthermore, by disposing the first and second secondary separation structures SS1 and SS2, a relatively large amount of gate electrodes GE without defects may be stacked, thereby improving the degree of integration of semiconductor device.

As set forth above, according to example embodiments, a three-dimensional semiconductor device, in which the number of stacked gate electrodes may be increased, may be provided, thereby improving a degree of integration of a semiconductor device.

While example embodiments have been shown and described above, it will be apparent to those skilled in the art that modifications and variations could be made without departing from the scope of the present inventive concept as defined by the appended claims.

What is claimed is:
1. A three-dimensional semiconductor device comprising:
   main separation structures on a substrate, and extending in a first direction, parallel to a surface of the substrate;
   gate electrodes between the main separation structures;
   a first secondary separation structure penetrating through the gate electrodes, between the main separation structures, and including a first linear portion and a second linear portion, having end portions opposing each other; and second secondary separation structures between the first secondary separation structure and the main separation structures, and penetrating through the gate electrodes, wherein the second secondary separation structures have end portions opposing each other between the second linear portion and the main separation structures.

2. The three-dimensional semiconductor device of claim 1, wherein each of the second secondary separation structures has a shorter length than a length of the second linear portion, in the first direction.

3. The three-dimensional semiconductor device of claim 1, wherein each of the main separation structures, the first secondary separation structure, and the second secondary separation structures comprises a conductive pattern and an insulating spacer on a side of the conductive pattern.

4. The three-dimensional semiconductor device of claim 3, further comprising impurity regions disposed in the substrate below the main separation structures, the first secondary separation structure, and the second secondary separation structures.

5. The three-dimensional semiconductor device of claim 1:
wherein the substrate comprises a memory cell array region and a connection region,
wherein the gate electrodes are stacked in a direction perpendicular to the surface of the substrate in the memory cell array region, and extend to the connection region, and
wherein the gate electrodes comprise pad regions arranged in a stepwise manner in the connection region.

6. The three-dimensional semiconductor device of claim 5, further comprising vertical structures on the substrate,
wherein the vertical structures comprise vertical memory cell structures on the memory cell array region and penetrating through the gate electrodes, and vertical dummy structures on the connection region and penetrating through the pad regions; and
wherein a density of disposition of the vertical memory cell structures on the memory cell array region is higher than a density of disposition of the vertical dummy structures disposed on the connection region.

7. The three-dimensional semiconductor device of claim 6, wherein each of the vertical structures comprises a channel semiconductor layer extending in the direction perpendicular to the surface of the substrate, and a data storage layer between the channel semiconductor layer and the gate electrodes.

8. The three-dimensional semiconductor device of claim 6, wherein the vertical dummy structures are spaced apart from a boundary between the pad regions when viewed from above.

9. The three-dimensional semiconductor device of claim 6, wherein a portion of the vertical dummy structures penetrates through a boundary between the pad regions when viewed from above.

10. The three-dimensional semiconductor device of claim 6, wherein a portion of the vertical dummy structures is between the end portions of the second secondary separation structures opposing each other.

11. A three-dimensional semiconductor device comprising:
main separation structures traversing a memory cell array region and a connection region of a substrate;
gate electrodes including pad regions, sequentially stacked on the memory cell array region and extending to the connection region to be arranged in a stepped manner in the connection region, between the main separation structures;
a first secondary separation structure penetrating through the gate electrodes between the main separation structures, and including a first linear portion extending to the connection region while traversing the memory cell array region, and a second linear portion disposed on the connection region and having an end portion opposing the first linear portion in the connection region; and
second secondary separation structures disposed between the first secondary separation structure and the main separation structures, and penetrating through the gate electrodes,
wherein the second secondary separation structures have end portions opposing each other in the connection region.

12. The three-dimensional semiconductor device of claim 11, wherein the end portions of the second secondary separation structures, opposing each other, are between the second linear portion of the first secondary separation structure and the main separation structures.

13. The three-dimensional semiconductor device of claim 11:
wherein the gate electrodes comprise a lower gate electrode, a plurality of intermediate gate electrodes disposed on the lower gate electrode, and a plurality of upper gate electrodes disposed on the plurality of intermediate gate electrodes;
wherein the plurality of upper gate electrodes comprise an upper select gate electrode;
wherein the first linear portion traverses the upper select gate electrode; and
wherein the second linear portion is spaced apart from the upper select gate electrode.

14. The three-dimensional semiconductor device of claim 13, wherein the second secondary separation structures are spaced apart from the upper select gate electrode.

15. The three-dimensional semiconductor device of claim 13, further comprising vertical structures disposed on the substrate,
wherein the vertical structures include vertical memory cell structures on the memory cell array region and penetrating through the gate electrodes, and vertical dummy structures disposed on the connection region and penetrating through the pad regions; and
wherein a portion of the vertical dummy structures is between opposing end portions of the first and second linear portions and between opposing end portions of the second secondary separation structures.

16. A three-dimensional semiconductor device comprising:
a substrate including a memory cell array region and a connection region adjacent to the memory cell array region;
gate electrodes stacked in a direction perpendicular to a surface of the substrate in the memory cell array region, and extending to the connection region;
main separation structures penetrating through the gate electrodes, while traversing the memory cell array region and the connection region;
a first secondary separation structure including a first linear portion and a second linear portion, penetrating through the gate electrodes between the main separation structures, and having opposing end portions in the connection region; and second secondary separation structures located on both sides of the first secondary separation structure, and penetrating through the gate electrodes between the first secondary separation structure and the main separation structures, wherein the second secondary separation structures have end portions spaced apart from each other while opposing each other, in the connection region; and wherein each of the second secondary separation structures has a length shorter than a length of each of the first and second linear portions of the first secondary separation structure.

17. The three-dimensional semiconductor device of claim 16:

wherein one of the gate electrodes comprises a first gate connection portion between the first and second linear portions, and a second gate connection portion between the second secondary separation structures; and wherein the second gate connection portions are closer to the main separation structures than the first gate connection portion adjacent to the main separation structures.

18. The three-dimensional semiconductor device of claim 16:

wherein the gate electrodes comprise a lower gate electrode, a plurality of intermediate gate electrodes on the lower gate electrode, and a plurality of upper gate electrodes on the plurality of intermediate gate electrodes;

wherein the second linear portion of the first secondary separation structure is spaced apart from the plurality of upper gate electrodes; and wherein the gate electrode including the first and second gate connection portions is one of the plurality of intermediate gate electrodes and the lower gate electrode.

19. The three-dimensional semiconductor device of claim 17, further comprising vertical structures disposed on the substrate, wherein the vertical structures include vertical memory cell structures on the memory cell array region and penetrating through the gate electrodes, and vertical dummy structures on the connection region and penetrating through pad regions of the gate electrodes; and wherein a portion of the vertical dummy structures penetrates through the first and second gate connection portions.

20. The three-dimensional semiconductor device of claim 16, wherein the gate electrodes comprise pad regions having thicknesses increased to be greater than thicknesses of the gate electrodes, in the connection region.

* * * * *